(12) United States Patent
Teig et al.

(10) Patent No.: US 10,615,149 B2
(45) Date of Patent: Apr. 7, 2020

(54) 3D PROCESSOR

(71) Applicant: Xcelsis Corporation, San Jose, CA (US)

(72) Inventors: Steven L. Teig, Menlo Park, CA (US); Ilyas Mohammed, San Jose, CA (US); Kenneth Duong, San Jose, CA (US); Javier DeLaCruz, San Jose, CA (US)

(73) Assignee: Xcelsis Corporation, San Jose, CA (US)

( * ) Notice: Subject to any disclaimer, the term of this patent is extended or adjusted under 35 U.S.C. 154(b) by 0 days.

(21) Appl. No.: 16/159,705

(22) Filed: Oct. 14, 2018

(65) Prior Publication Data

US 2019/0123024 A1    Apr. 25, 2019

Related U.S. Application Data

(63) Continuation-in-part of application No. 15/859,546, filed on Dec. 31, 2017, which is a
(Continued)

(51) Int. Cl.
*H01L 25/065* (2006.01)
*H01L 23/00* (2006.01)

(52) U.S. Cl.
CPC .......... *H01L 25/0657* (2013.01); *H01L 24/92* (2013.01); *H01L 24/03* (2013.01);
(Continued)

(58) Field of Classification Search
CPC ............................ H01L 25/0657; H01L 24/32
See application file for complete search history.

(56) References Cited

U.S. PATENT DOCUMENTS

| | | |
|---|---|---|
| 5,016,138 A | 5/1991 | Woodman |
| 5,579,207 A | 11/1996 | Hayden et al. |

(Continued)

FOREIGN PATENT DOCUMENTS

| | | |
|---|---|---|
| WO | 2019079625 A1 | 4/2019 |
| WO | 2019079631 A1 | 4/2019 |

OTHER PUBLICATIONS

Author Unknown, "Fact Sheet: New Intel Architectures and Technologies Target Expanded Market Opportunities," Dec. 12, 2018, 9 pages, Intel Corporation, Santa Clara, California.
(Continued)

*Primary Examiner* — Ida M Soward
(74) *Attorney, Agent, or Firm* — Adeli LLP

(57) ABSTRACT

Some embodiments of the invention provide a three-dimensional (3D) circuit that is formed by vertically stacking two or more integrated circuit (IC) dies to at least partially overlap. In this arrangement, several circuit blocks defined on each die (1) overlap with other circuit blocks defined on one or more other dies, and (2) electrically connect to these other circuit blocks through connections that cross one or more bonding layers that bond one or more pairs of dies. In some embodiments, the overlapping, connected circuit block pairs include pairs of computation blocks and pairs of computation and memory blocks. The connections that cross bonding layers to electrically connect circuit blocks on different dies are referred to below as z-axis wiring or connections. This is because these connections traverse completely or mostly in the z-axis of the 3D circuit, with the x-y axes of the 3D circuit defining the planar surface of the IC die substrate or interconnect layers. These connections are also referred to as vertical connections to differentiate them from the horizontal planar connections along the interconnect layers of the IC dies.

20 Claims, 27 Drawing Sheets

Related U.S. Application Data continuation-in-part of application No. 15/859,548, filed on Dec. 31, 2017, application No. 16/159,705, filed on Oct. 14, 2018, which is a continuation-in-part of application No. 15/859,551, filed on Dec. 31, 2017, application No. 16/159,705, filed on Oct. 14, 2018, which is a continuation-in-part of application No. 15/859,612, filed on Dec. 31, 2017, application No. 16/159,705, filed on Oct. 14, 2018, which is a continuation-in-part of application No. 15/725,030, filed on Oct. 4, 2017, now Pat. No. 10,522,352, application No. 16/159,705, filed on Oct. 14, 2018, which is a continuation-in-part of application No. 15/976,809, filed on May 10, 2018.

(60) Provisional application No. 62/678,246, filed on May 30, 2018, provisional application No. 62/541,064, filed on Aug. 3, 2017, provisional application No. 62/575,221, filed on Oct. 20, 2017, provisional application No. 62/575,259, filed on Oct. 20, 2017, provisional application No. 62/405,833, filed on Oct. 7, 2016, provisional application No. 62/619,910, filed on Jan. 21, 2018, provisional application No. 62/575,184, filed on Oct. 20, 2017, provisional application No. 62/575,240, filed on Oct. 20, 2017.

(52) U.S. Cl.
CPC ............... *H01L 24/08* (2013.01); *H01L 24/11* (2013.01); *H01L 24/16* (2013.01); *H01L 24/32* (2013.01); *H01L 24/80* (2013.01); *H01L 2224/08145* (2013.01); *H01L 2224/16145* (2013.01); *H01L 2224/16225* (2013.01); *H01L 2224/17181* (2013.01); *H01L 2224/32145* (2013.01); *H01L 2224/80895* (2013.01); *H01L 2224/80896* (2013.01); *H01L 2224/9202* (2013.01); *H01L 2225/06548* (2013.01)

(56) References Cited

U.S. PATENT DOCUMENTS

| | | | |
|---|---|---|---|
| 5,673,478 A | 10/1997 | Beene et al. | |
| 6,707,124 B2* | 3/2004 | Wachtler | H01L 23/055 257/432 |
| 6,909,194 B2* | 6/2005 | Farnworth | H01L 23/49816 257/734 |
| 7,046,522 B2* | 5/2006 | Sung | H01L 25/0657 174/262 |
| 7,638,869 B2 | 12/2009 | Irsigler et al. | |
| 7,692,946 B2 | 4/2010 | Taufique et al. | |
| 8,032,711 B2 | 10/2011 | Black et al. | |
| 8,110,899 B2 | 2/2012 | Reed et al. | |
| 8,148,814 B2 | 4/2012 | Furuta et al. | |
| 8,516,409 B2 | 8/2013 | Coteus et al. | |
| 8,546,955 B1 | 10/2013 | Wu | |
| 8,547,769 B2 | 10/2013 | Saraswat et al. | |
| 8,704,384 B2 | 4/2014 | Wu et al. | |
| 8,736,068 B2 | 5/2014 | Bartley et al. | |
| 8,797,818 B2 | 8/2014 | Jeddeloh | |
| 8,816,506 B2 | 8/2014 | Kawashita et al. | |
| 8,860,199 B2 | 10/2014 | Black et al. | |
| 8,907,439 B1* | 12/2014 | Kay | H01L 27/14634 257/292 |
| 8,930,647 B1* | 1/2015 | Smith | G06F 9/44557 711/154 |
| 9,067,272 B2 | 6/2015 | Sutanto et al. | |
| 9,076,700 B2 | 7/2015 | Kawashita et al. | |
| 9,318,418 B2 | 4/2016 | Kawashita et al. | |
| 9,478,496 B1 | 10/2016 | Lin | |
| 9,497,854 B2 | 11/2016 | Giuliano | |
| 9,501,603 B2 | 11/2016 | Barowski et al. | |
| 9,508,607 B2* | 11/2016 | Chua-Eoan | H01L 23/34 |
| 9,640,233 B2* | 5/2017 | Sohn | G11C 11/1675 |
| 9,645,603 B1 | 5/2017 | Chall et al. | |
| 9,647,187 B1* | 5/2017 | Yap | G02F 1/025 |
| 9,691,739 B2 | 6/2017 | Kawashita et al. | |
| 9,746,517 B2 | 8/2017 | Whetsel | |
| 9,915,978 B2 | 3/2018 | Dabby et al. | |
| 10,255,969 B2 | 4/2019 | Eom et al. | |
| 10,262,911 B1* | 4/2019 | Gong | H01L 22/34 |
| 10,269,586 B2* | 4/2019 | Chou | H01L 24/11 |
| 10,373,657 B2* | 8/2019 | Kondo | G06F 13/4282 |
| 10,446,207 B2* | 10/2019 | Kim | G11C 11/1693 |
| 2001/0017418 A1 | 8/2001 | Noguchi et al. | |
| 2005/0127490 A1 | 6/2005 | Black et al. | |
| 2007/0220207 A1 | 9/2007 | Black et al. | |
| 2009/0070727 A1 | 3/2009 | Solomon | |
| 2010/0140750 A1 | 6/2010 | Toms | |
| 2012/0201068 A1 | 8/2012 | Ware | |
| 2013/0051116 A1* | 2/2013 | En | H01L 25/18 365/148 |
| 2013/0187292 A1 | 7/2013 | Semmelmeyer et al. | |
| 2013/0207268 A1 | 8/2013 | Chapelon | |
| 2013/0275823 A1* | 10/2013 | Cordero | H03K 19/17796 714/718 |
| 2014/0022002 A1* | 1/2014 | Chua-Eoan | H01L 23/34 327/512 |
| 2015/0228584 A1 | 8/2015 | Huang et al. | |
| 2016/0111386 A1 | 4/2016 | England et al. | |
| 2016/0225431 A1 | 8/2016 | Best et al. | |
| 2016/0233134 A1 | 8/2016 | Lim et al. | |
| 2016/0329312 A1 | 11/2016 | O'Mullan et al. | |
| 2016/0379115 A1 | 12/2016 | Burger et al. | |
| 2017/0092615 A1 | 3/2017 | Oyamada | |
| 2017/0092616 A1 | 3/2017 | Su et al. | |
| 2017/0148737 A1* | 5/2017 | Fasano | H01L 25/18 |
| 2017/0213787 A1 | 7/2017 | Alfano et al. | |
| 2017/0278213 A1* | 9/2017 | Eckert | G06T 1/20 |
| 2017/0301625 A1* | 10/2017 | Mahajan | H01L 23/5381 |
| 2018/0286800 A1* | 10/2018 | Kamal | H01L 25/50 |
| 2018/0330992 A1 | 11/2018 | Delacruz et al. | |
| 2018/0330993 A1 | 11/2018 | Delacruz et al. | |
| 2018/0331037 A1 | 11/2018 | Mohammed et al. | |
| 2018/0331038 A1 | 11/2018 | Delacruz et al. | |
| 2018/0331072 A1 | 11/2018 | Nequist et al. | |
| 2018/0331094 A1 | 11/2018 | Delacruz et al. | |
| 2018/0331095 A1 | 11/2018 | Delacruz et al. | |
| 2018/0350775 A1* | 12/2018 | DeLaCruz | H01L 24/05 |
| 2019/0042377 A1 | 2/2019 | Teig et al. | |
| 2019/0042912 A1 | 2/2019 | Teig et al. | |
| 2019/0042929 A1 | 2/2019 | Teig et al. | |
| 2019/0043832 A1 | 2/2019 | Teig et al. | |
| 2019/0051641 A1* | 2/2019 | Lee | H01L 21/563 |
| 2019/0123022 A1 | 4/2019 | Teig et al. | |
| 2019/0123023 A1 | 4/2019 | Teig et al. | |
| 2019/0244933 A1 | 8/2019 | Or-Bach et al. | |

OTHER PUBLICATIONS

Author Unknown, "Vector Supercomputer SX Series: SX—Aurora TSUBASA," Oct. 2017, 2 pages, NEC Corporation.

Bansal, Samta, "3D-IC is Now Real: Wide-IO is Driving 3D-IC TSV," Cadence Flash Memory Summit, Aug. 2012, 14 pages, Cadence Design Systems, Inc.

Black, Bryan, "Die Stacking is Happening!," Dec. 9, 2013, 53 pages, Advanced Micro Devices, Inc., Santa Clara, California.

Black, Bryan, et al., "3D Processing Technology and its Impact on iA32 Microprocessors," Proceedings of 2004 IEEE International Conference on Computer Design: VLSI in Computers and Processors, Oct. 11-13, 2004, 3 pages, IEEE, San Jose, California.

Black, Bryan, et al., "Die Stacking (3D) Microarchitecture," Proceedings of the 39th Annual IEEE/ACM International Symposium on Microarchitecture, Dec. 9-13, 2006, 11 pages, IEEE, Orlando, Florida.

Hajkazemi, Mohammad Hossein, et al., "Wide I/O or LPDDR? Exploration and Analysis of Performance, Power and Temperature Trade-offs of Emerging DRAM Technologies in Embedded MPSoCs,"

(56) References Cited

OTHER PUBLICATIONS

Proceedings of 33rd IEEE International Conference on Computer Design (ICCD), Oct. 18-21, 2015, 8 pages, IEEE, New York City, New York.

Invitation to Pay Additional Fees for Commonly Owned International Patent Application PCT/US2018/056559, mailed Feb. 7, 2019, 15 pages, International Searching Authority (EPO).

Invitation to Pay Additional Fees for Commonly Owned International Patent Application PCT/US2018/056565, mailed Feb. 12, 2019, 13 pages, International Searching Authority (EPO).

Kim, Jung-Sik, et al., "A 1.2 V 12.8 GB/s 2 Gb Mobile Wide-I/O DRAM With 4x128 I/Os Using TSV Based Stacking," IEEE Journal of Solid-State Circuits, Jan. 2012, 10 pages, vol. 47, No. 1, IEEE.

Loh, Gabriel H., et al., "Processor Design in 3D Die-Stacking Technologies," IEEE Micro, May/Jun. 2007, 18 pages, vol. 27, Issue 3, IEEE Computer Society.

Nakamoto, Mark, et al., "Simulation Methodology and Flow Integration for 3D IC Stress Management," 2010 IEEE Custom Integrated Circuits Conference, Sep. 19-22, 2010, 4 pages, IEEE, San Jose, CA, USA.

Tran, Kevin, et al., "Start Your HBM/2.5D Design Today," High-Bandwidth Memory White Paper, Mar. 29, 2016, 6 pages, Amkor Technology, Inc., San Jose, CA, USA.

Wu, Xiaoxia, et al., "Electrical Characterization for Intertier Connections and Timing Analysis for 3-D ICs," IEEE Transactions on Very Large Scale Integration (VLSI) Systems, Dec. 6, 2010, 5 pages, IEEE.

\* cited by examiner

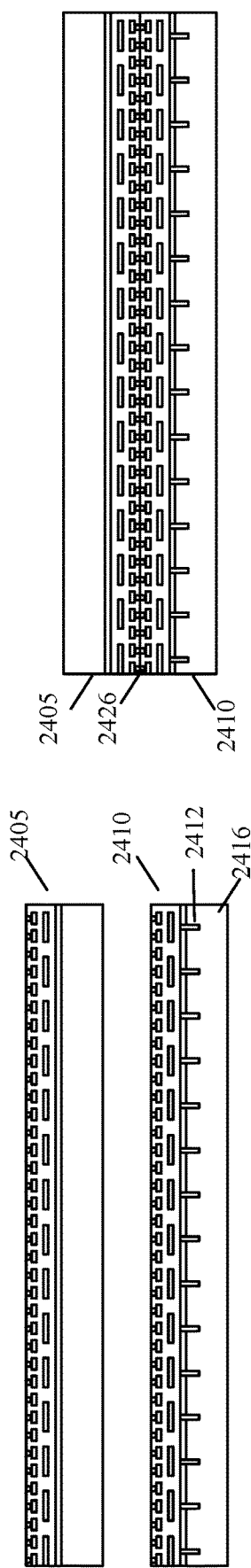
*Figure 24*
*Figure 25*
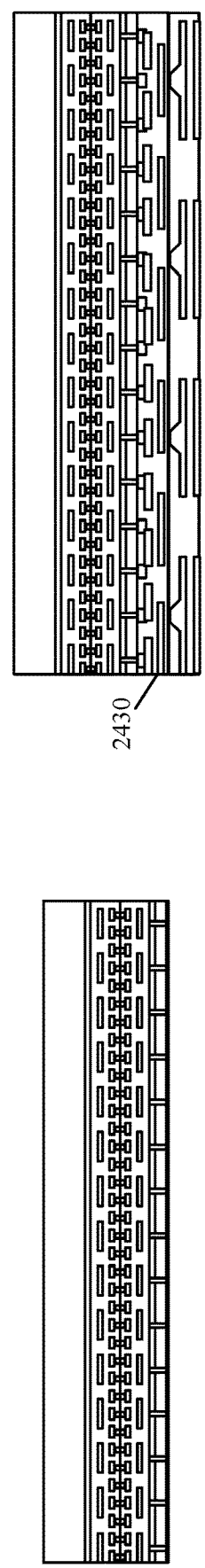
*Figure 26*
*Figure 27*

3D PROCESSOR

CLAIM OF BENEFIT

This application claims benefit to U.S. Provisional Patent Application 62/678,246 filed May 30, 2018, U.S. Provisional Patent Application 62/619,910 filed Jan. 21, 2018, U.S. Provisional Patent Application 62/575,221 filed Oct. 20, 2017, U.S. Provisional Patent Application 62/575,184 filed Oct. 20, 2017, U.S. Provisional Patent Application 62/575,240 filed Oct. 20, 2017, and U.S. Provisional Patent Application 62/575,259 filed Oct. 20, 2017. This application is a continuation-in-part of U.S. Non-Provisional patent application Ser. Nos. 15/859,546, now published as U.S. Patent Publication 2019/0042912; 15/859,548, now published as U.S. Patent Publication 2019/0043832; 15/859,551, now published as U.S. Patent Publication 2019/0042929; and 15/859,612, now published as U.S. Patent Publication 2019/0042377, all of which were filed on Dec. 31, 2017, and all of which claim benefit of U.S. Provisional Patent Application 62/541,064, filed on Aug. 3, 2017. This application is also a continuation-in-part of U.S. Non-Provisional patent application Ser. No. 15/976,809, filed on May 10, 2018, now published as U.S. Patent Publication 2018/0331037, which claims the benefit of U.S. Provisional Patent Application 62/619,910, filed Jan. 21, 2018. This application is also a continuation-in-part of U.S. Non-Provisional patent application Ser. No. 15/725,030, filed on Oct. 4, 2017, now issued as U.S. Pat. No. 10,522,352 which claims the benefit of U.S. Provisional Patent Application 62/405,833 filed Oct. 7, 2016. U.S. Provisional Patent Applications 62/678,246, 62/619,910, 62/575,221, 62/575,184, 62/575,240, 62/575,259, and 62/405,833 are incorporated herein by reference. U.S. Non-Provisional patent application Ser. Nos. 15/859,546, now published as U.S. Patent Publication 2019/0042912; 15/859,548, now published as U.S. Patent Publication 2019/0043832; 15/859,551, now published as U.S. Patent Publication 2019/0042929; 15/859,612, now published as U.S. Patent Publication 2019/0042377, 15/976,809, now published as U.S. Patent Publication 2018/0331037, and 15/725,030, now issued as U.S. Pat. No. 10,522,352, are incorporated herein by reference.

BACKGROUND

Electronic circuits are commonly fabricated on a wafer of semiconductor material, such as silicon. A wafer with such electronic circuits is typically cut into numerous dies, with each die being referred to as an integrated circuit (IC). Each die is housed in an IC case and is commonly referred to as a microchip, "chip," or IC chip. According to Moore's law (first proposed by Gordon Moore), the number of transistors that can be defined on an IC die will double approximately every two years. With advances in semiconductor fabrication processes, this law has held true for much of the past fifty years. However, in recent years, the end of Moore's law has been prognosticated as we are reaching the maximum number of transistors that can possibly be defined on a semiconductor substrate. Hence, there is a need in the art for other advances that would allow more transistors to be defined in an IC chip.

BRIEF SUMMARY

Some embodiments of the invention provide a three-dimensional (3D) circuit that is formed by vertically stacking two or more integrated circuit (IC) dies to at least partially overlap. In this arrangement, several circuit blocks defined on each die (1) overlap with other circuit blocks defined on one or more other dies, and (2) electrically connect to these other circuit blocks through connections that cross one or more bonding layers that bond one or more pairs of dies. The 3D circuit in some embodiments can be any type of circuit such as a processor, like a CPU (central processing unit), a GPU (graphics processing unit), a TPU (tensor processing unit), etc., or other kind of circuits, like an FPGA (field programmable gate array), AI (artificial intelligence) neural network chip, encrypting/decrypting chips, etc.

The connections in some embodiments cross the bonding layer(s) in a direction normal to the bonded surface. In some embodiments, the overlapping, connected circuit block pairs include pairs of computation blocks and pairs of computation and memory blocks. The connections that cross bonding layers to electrically connect circuit blocks on different dies are referred to below as z-axis wiring or connections. This is because these connections traverse completely or mostly in the z-axis of the 3D circuit, with the x-y axes of the 3D circuit defining the planar surface of the IC die substrate or interconnect layers. These connections are also referred to as vertical connections to differentiate them from the horizontal planar connections along the interconnect layers of the IC dies.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, the Drawings and the Claims is needed.

BRIEF DESCRIPTION OF THE DRAWINGS

The novel features of the invention are set forth in the appended claims. However, for purposes of explanation, several embodiments of the invention are set forth in the following figures.

FIGS. 24-27 show two wafers at different stages of the fabrication process of FIG. 23.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments of the invention provide a three-dimensional (3D) circuit that is formed by vertically stacking two or more integrated circuit (IC) dies to at least partially overlap. In this arrangement, several circuit blocks defined on each die (1) overlap with other circuit blocks defined on one or more other dies, and (2) electrically connect to these other circuit blocks through connections that cross one or more bonding layers that bond one or more pairs of dies. In some embodiments, the overlapping, connected circuit block pairs include pairs of computation blocks and pairs of computation and memory blocks.

In the discussion below, the connections that cross bonding layers to electrically connect circuit blocks on different dies are referred to below as z-axis wiring or connections. This is because these connections traverse completely or mostly in the z-axis of the 3D circuit (e.g., because these connections in some embodiments cross the bonding layer(s) in a direction normal or nearly normal to the bonded surface), with the x-y axes of the 3D circuit defining the planar surface of the IC die substrate or interconnect layers. These connections are also referred to as vertical connections to differentiate them from the horizontal planar connections along the interconnect layers of the IC dies.

The discussion above and below refers to different circuit blocks on different dies overlapping with each other. As illustrated in the figures described below, two circuit blocks on two vertically stacked dies overlap when their horizontal cross sections (i.e., their horizontal footprint) vertically overlap (i.e., have an overlap in the vertical direction).

Figure 1:
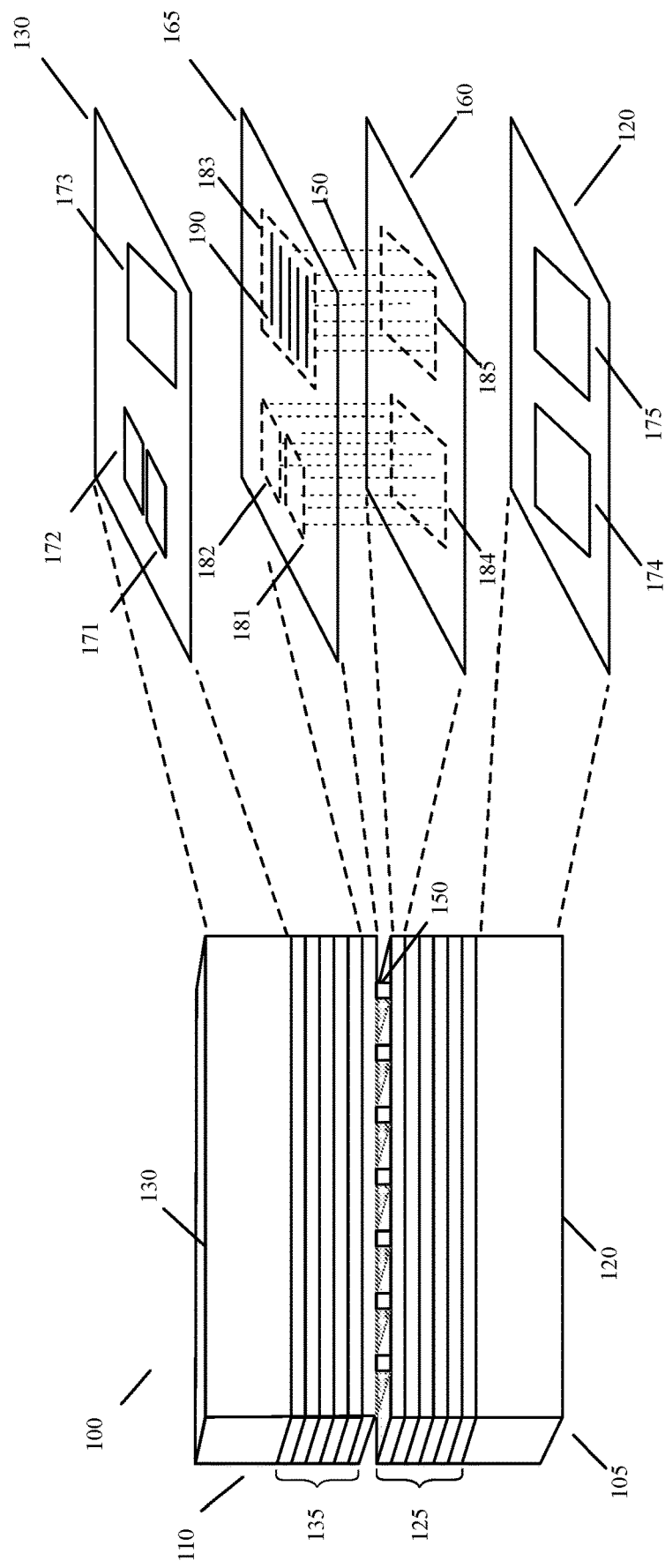
FIG. 1 illustrates a 3D circuit of some embodiments of the invention.

FIG. 1 illustrates an example of such a 3D circuit. Specifically, it illustrates a 3D circuit 100 that is formed by vertically stacking two IC dies 105 and 110 such that each of several circuit blocks on one die (1) overlaps at least one other circuit block on the other die, and (2) electrically connects to the overlapping die in part through z-axis connections 150 that cross a bonding layer that bonds the two IC dies. In this example, the two dies 105 and 110 are face-to-face mounted as further described below. Also, although not shown in FIG. 1, the stacked first and second dies in some embodiments are encapsulated into one integrated circuit package by an encapsulating epoxy and/or a chip case.

As shown, the first die 105 includes a first semiconductor substrate 120 and a first set of interconnect layers 125 defined above the first semiconductor substrate 120. Similarly, the second IC die 110 includes a second semiconductor substrate 130 and a second set of interconnect layers 135 defined below the second semiconductor substrate 130. In some embodiments, numerous electronic components (e.g., active components, like transistors and diodes, or passive components, like resistors and capacitors) are defined on the first semiconductor substrate 120 and on the second semiconductor substrate 130.

The electronic components on the first substrate 120 are connected to each other through interconnect wiring on the first set of interconnect layers 125 to form numerous microcircuits (e.g., Boolean gates, such as AND gates, OR gates, etc.) and/or larger circuit blocks (e.g., functional blocks, such as memories, decoders, logic units, multipliers, adders, etc.). Similarly, the electronic components on the second substrate 130 are connected to each other through interconnect wiring on the second set of interconnect layers 135 to form additional microcircuits and/or larger circuit block.

In some embodiments, a portion of the interconnect wiring needed to define a circuit block on one die's substrate (e.g., substrate 120 of the first die 105) is provided by interconnect layer(s) (e.g., the second set interconnect layers 135) of the other die (e.g., the second die 110). In other words, the electronic components on one die's substrate (e.g., the first substrate 120 of the first die 105) in some embodiments are also connected to other electronic components on the same substrate (e.g., substrate 120) through interconnect wiring on the other die's set of interconnect layers (e.g., the second set of interconnect layers 135 of the second die 110) to form a circuit block on the first die.

As such, the interconnect layers of one die can be shared by the electronic components and circuits of the other die in some embodiments. The interconnect layers of one die can also be used to carry power, clock and data signals for the electronic components and circuits of the other die, as described in U.S. patent application Ser. No. 15/976,815 filed May 10, 2018, now published as U.S. Patent Publication 2018/0330992, which is incorporated herein by reference. The interconnect layers that are shared between two dies are referred to as the shared interconnect layers in the discussion below.

Each interconnect layer of an IC die typically has a preferred wiring direction (also called routing direction). Also, in some embodiments, the preferred wiring directions of successive interconnect layers of an IC die are orthogonal to each other. For example, the preferred wiring directions of an IC die typically alternate between horizontal and vertical preferred wiring directions, although several wiring architectures have been introduced that employ 45 degree and 60 degree offset between the preferred wiring directions of successive interconnect layers. Alternating the wiring directions between successive interconnect layers of an IC die has several advantages, such as providing better signal routing and avoiding capacitive coupling between long parallel segments on adjacent interconnect layers.

To form the 3D circuit 100 of FIG. 1, the first and second dies are face-to-face stacked so that the first and second set of interconnect layers 125 and 135 are facing each other. The top interconnect layers 160 and 165 are bonded to each other through a direct bonding process that establishes direct-contact metal-to-metal bonding, oxide bonding, or fusion bonding between these two sets of interconnect layers. An example of such bonding is copper-to-copper (Cu—Cu) metallic bonding between two copper conductors in direct contact. In some embodiments, the direct bonding is provided by a hybrid bonding technique such as DBI® (direct bond interconnect) technology, and other metal bonding techniques (such as those offered by Invensas Bonding Technologies, Inc., an Xperi Corporation company, San Jose, Calif.). In some embodiments, DBI connects span across silicon oxide and silicon nitride surfaces.

The DBI process is further described in U.S. Pat. Nos. 6,962,835 and 7,485,968, both of which are incorporated herein by reference. This process is also described in U.S. patent application Ser. No. 15/725,030, now published as U.S. Patent Publication 2018/0102251, which is also incorporated herein by reference. As described in U.S. patent application Ser. No. 15/725,030, the direct bonded connections between two face-to-face mounted IC dies are native interconnects that allow signals to span two different dies with no standard interfaces and no input/output protocols at the cross-die boundaries. In other words, the direct bonded interconnects allow native signals from one die to pass directly to the other die with no modification of the native signal or negligible modification of the native signal, thereby forgoing standard interfacing and consortium-imposed input/output protocols.

Direct bonded interconnects allow circuits to be formed across and/or to be accessed through the cross-die boundary of two face-to-face mounted dies. Examples of such circuits are further described in U.S. patent application Ser. No. 15/725,030. The incorporated U.S. Pat. Nos. 6,962,835, 7,485,968, and U.S. patent application Ser. No. 15/725,030 also describe fabrication techniques for manufacturing two face-to-face mounted dies.

A DBI connection between two dies terminates on electrical contacts (referred to as pads in this document) on each die's top interconnect layer. Through interconnect lines and/or vias on each die, the DBI-connection pad on each die electrically connects the DBI connection with circuit nodes on the die that need to provide the signal to the DBI connection or to receive the signal from the DBI connection. For instance, a DBI-connection pad connects to an interconnect segment on the top interconnect layer of a die, which then carries the signal to a circuit block on the die's substrate through a series of vias and interconnect lines. Vias are z-axis structures on each die that carry signals between the interconnect layers of the die and between the IC die substrate and the interconnect layers of the die.

As shown in FIG. 1, the direct bonding techniques of some embodiments allow a large number of direct connections 150 to be established between the top interconnect layer 165 of the second die 110 and top interconnect layer 160 of the first die 105. For these signals to traverse to other interconnect layers of the first die 105 or to the substrate 120 of the first die 105, the first die in some embodiments uses other IC structures (e.g., vias) to carry these signals from its top interconnect layer to these other layers and/or substrate. In some embodiments, more than 1,000 connections/mm$^2$, 10,000 connections/mm$^2$, 100,000 connections/mm$^2$, 1,000,000 connections/mm$^2$ or less, etc. can be established between the top interconnect layers 160 and 165 of the first and second dies 105 and 110 in order to allow signals to traverse between the first and second IC dies.

The direct-bonded connections 150 between the first and second dies are very short in length. For instance, based on current manufacturing technologies, the direct-bonded connections can range from a fraction of a micron to a single-digit or low double-digit microns (e.g., 2-10 microns). As further described below, the short length of these connections allows the signals traversing through these connections to reach their destinations quickly while experiencing no or minimal capacitive load from nearby planar wiring and nearby direct-bonded vertical connections. The planar wiring connections are referred to as x-y wiring or connections, as such wiring stays mostly within a plane defined by an x-y axis of the 3D circuit. On the other hand, vertical connections between two dies or between two interconnect layers are referred to as z-axis wiring or connections, as such wiring mostly traverses in the z-axis of the 3D circuit. The use of "vertical" in expressing a z-axis connection should not be confused with horizontal or vertical preferred direction planar wiring that traverses an individual interconnect layer.

In some embodiments, the pitch (distance) between two neighboring direct-bonded connections 150 can be extremely small, e.g., the pitch for two neighboring connections is between 0.5 μm to 15 μm. This close proximity allows for the large number and high density of such connections between the top interconnect layers 160 and 165 of the first and second dies 105 and 110. Moreover, the close proximity of these connections does not introduce much capacitive load between two neighboring z-axis connections because of their short length and small interconnect pad size. For instance, in some embodiments, the direct bonded connections are less then 1 or 2 μm in length (e.g., 0.1 to 0.5 μm in length), and facilitate short z-axis connections (e.g., 1 to 10 μm in length) between two different locations on the two dies even after accounting for the length of vias on each of the dies. In sum, the direct vertical connections between two dies offer short, fast paths between different locations on these dies.

Through the z-axis connections 150 (e.g., DBI connections), electrical nodes in overlapping portions of the circuit blocks on the first and second dies can be electrically connected. These electrical nodes can be on the IC die substrates (e.g., on the portions of the substrates that contain node of electronic components of the circuit blocks) or on the IC die interconnect layers (e.g., on the interconnect layer wiring that form the circuit block). When these electrical nodes are not on the top interconnect layers that are connected through the z-axis connections, vias are used to carry the signals to or from the z-axis connections to these nodes. On each IC die, vias are z-axis structures that carry signals between the interconnect layers and between the IC die substrate and the interconnect layers.

FIG. 1 illustrates numerous z-axis connections 150 between overlapping regions 181-185 in the top interconnect layers 160 and 165. Each of these regions corresponds to a circuit block 171-175 that is defined on one of the IC die substrates 120 and 130. Also, each region on the top interconnect layer of one die connects to one or more overlapping regions in the top interconnect layer of the other die through numerous z-axis connections. Specifically, as shown, z-axis connections connect overlapping regions 181 and 184, regions 182 and 184, and regions 183 and 185. Vias are used to provide signals to these z-axis connections from the IC die substrates and interconnect layers. Also, vias are used to carry signals from the z-axis connections when the electrical nodes that need to receive these signals are on the die substrates or the interconnect layers below the top layer.

When the z-axis connections are DBI connections, the density of connections between overlapping connected regions can be in the range of 1,000 connections/mm² to 1,000,000 connections/mm². Also, the pitch between two neighboring direct-bonded connections 150 can be extremely small, e.g., the pitch for two neighboring connections is between 0.5 μm to 15 μm. In addition, these connections can be very short, e.g., in the range from a fraction of a micron to a low single-digit microns. These short DBI connections would allow very short signal paths (e.g., single digit or low-double digit microns, such as 2-20 microns) between two electrically connected circuit nodes on the two substrates of the IC dies 105 and 110 even after accounting for interconnect-layer vias and wires.

In the example illustrated in FIG. 1, each top interconnect-layer region 181-185 corresponds to a circuit block region 171-175 on an IC die substrate 120 or 130. One of ordinary skill will realize that a circuit block's corresponding top interconnect-layer region (i.e., the region that is used to establish the z-axis connections for that circuit block) does not have to perfectly overlap the circuit block's region on the IC substrate. Moreover, in some embodiments, all the z-axis connections that are used to connect two overlapping circuit blocks in two different dies do not connect one contiguous region in the top-interconnect layer of one die with another contiguous region in the top-interconnect layer of the other die.

Also, in some embodiments, the z-axis connections connect circuits on the two dies that do not overlap (i.e., do not have any of their horizontal cross section vertically overlap). However, it is beneficial to use z-axis connections to electrically connect overlapping circuits (e.g., circuit blocks 173 and 175, circuit blocks 171 and 174, etc.) on the two dies 105 and 110 (i.e., circuits with horizontal cross sections that vertically overlap) because such overlaps dramatically increase the number of candidate locations for connecting the two circuits. When two circuits are placed next to each other on one substrate, the number of connections that can be established between them is limited by the number of connections that can be made through their perimeters on one or more interconnect layers. However, by placing the two circuits in two overlapping regions on two vertically stacked dies, the connections between the two circuits are not limited to periphery connections that come through the perimeter of the circuits, but also include z-axis connections (e.g., DBI connections and via connections) that are available through the area of the overlapping region.

Stacking IC dies in many cases allows the wiring for delivering the signals to be much shorter, as the stacking provides more candidate locations for shorter connections between overlapping circuit blocks that need to be interconnected to receive these signals. For instance, in FIG. 1, circuit blocks 173 and 175 on dies 105 and 110 share a data bus 190 on the top interconnect layer of the second die 110. This data bus carries data signals to both of these circuits.

Direct-bonded connections are used to carry signals from this data bus 190 to the circuit block 175 on the first die 105. These direct-bonded connections are much shorter than connections that would route data-bus signals on the first die about several functional blocks in order to reach the circuit block 175 from this block's periphery. The data signals that traverse the short direct-bonded connections reach this circuit 175 on the first die very quickly (e.g., within 1 or 2 clock cycles) as they do not need to be routed from the periphery of the destination block. On a less-congested shared interconnect layer, a data-bus line can be positioned over or near a destination circuit on the first die to ensure that the data-bus signal on this line can be provided to the destination circuit through a short direct-bonded connection.

Z-axis connection and the ability to share interconnect layers on multiple dies reduce the congestion and route limitations that may be more constrained on one die than another. Stacking IC dies also reduces the overall number of interconnect layers of the two dies because it allows the two dies to share some of the higher-level interconnect layers in order to distribute signals. Reducing the higher-level interconnect layers is beneficial as the wiring on these layers often consumes more space due to their thicker, wider and coarser arrangements.

Even though in FIG. 1 the two dies are face-to-face mounted, one of ordinary skill will realize that in other embodiments two dies are vertically stacked in other arrangements. For instance, in some embodiments, these two dies are face-to-back stacked (i.e., the set of interconnect layers of one die is mounted next to the backside of the semiconductor substrate of the other die), or back-to-back stacked (i.e., the backside of the semiconductor substrate of one die is mounted next to the backside of the semiconductor substrate of the other die).

In other embodiments, a third die (e.g., an interposer die) is placed between the first and second dies, which are face-to-face stacked, face-to-back stacked (with the third die between the backside of the substrate of one die and the set of interconnect layers of the other die), or back-to-back stacked (with the third die between the backsides of the substrates of the first and second dies). Also, as further described by reference to FIG. 4, the vertical stack of dies in some embodiments includes three or more IC dies in a stack. While some embodiments use a direct bonding technique to establish connections between the top interconnect layers of two face-to-face stacked dies, other embodiments use alternative connection schemes (such as through silicon vias, TSVs, through-oxide vias, TOVs, or through-glass vias, TGVs) to establish connections between face-to-back dies and between back-to-back dies.

Figure 2:
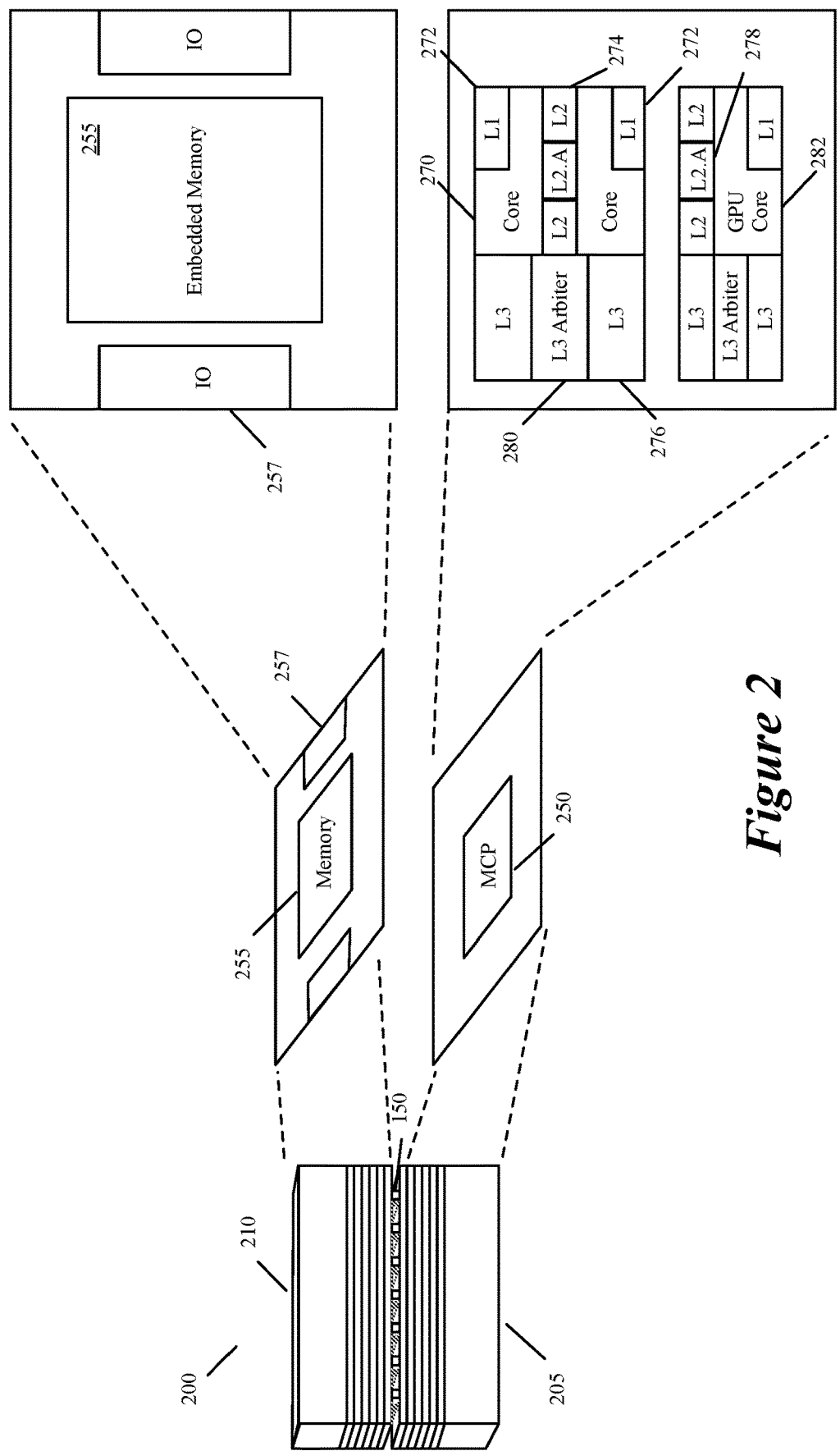
FIG. 2 illustrates an example of a high-performance 3D processor that has a multi-core processor on one die and an embedded memory on another die.
Figure 4:
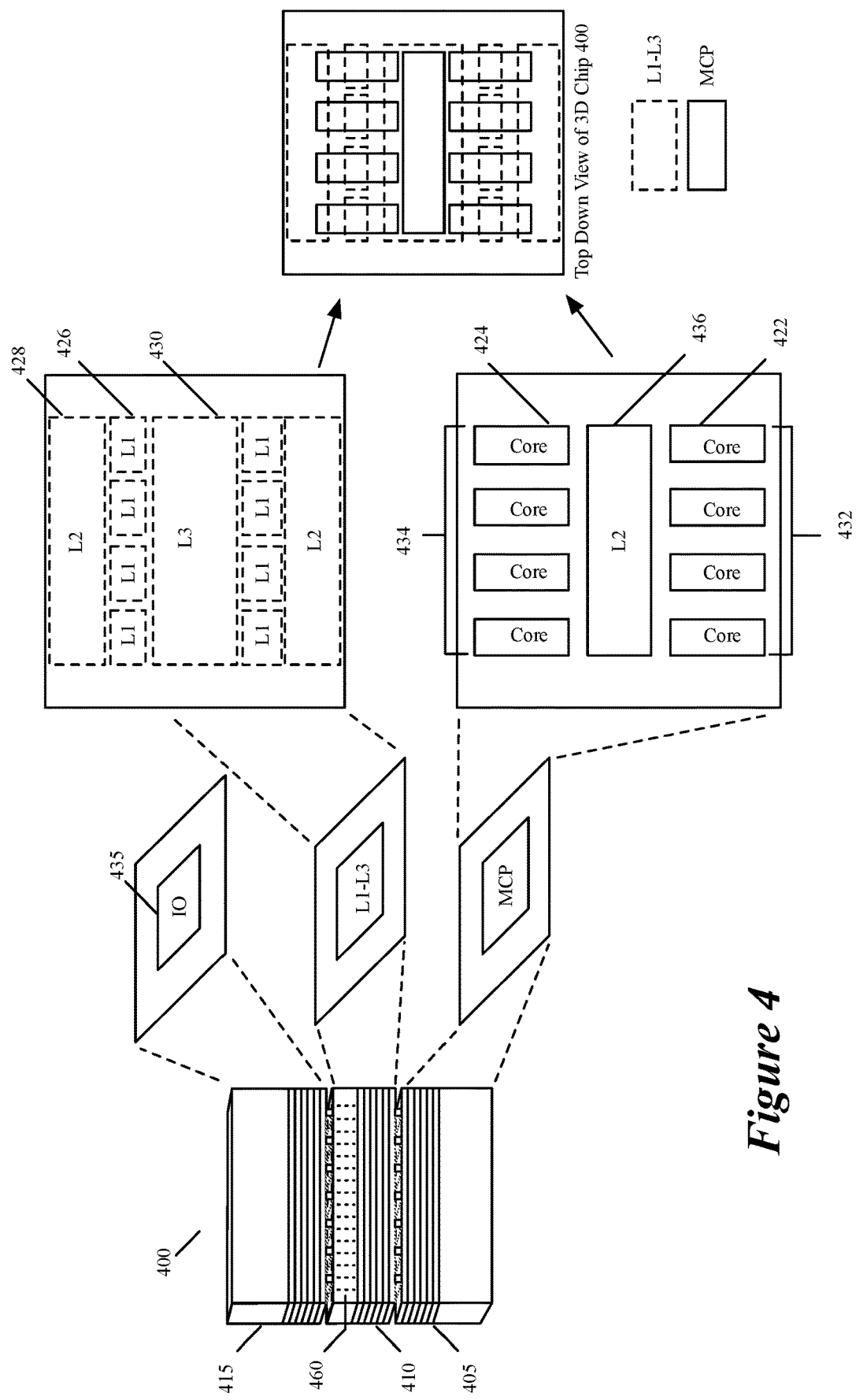
FIG. 4 illustrates an example of a 3D processor that is formed by vertically stacking three dies.
Figure 6:
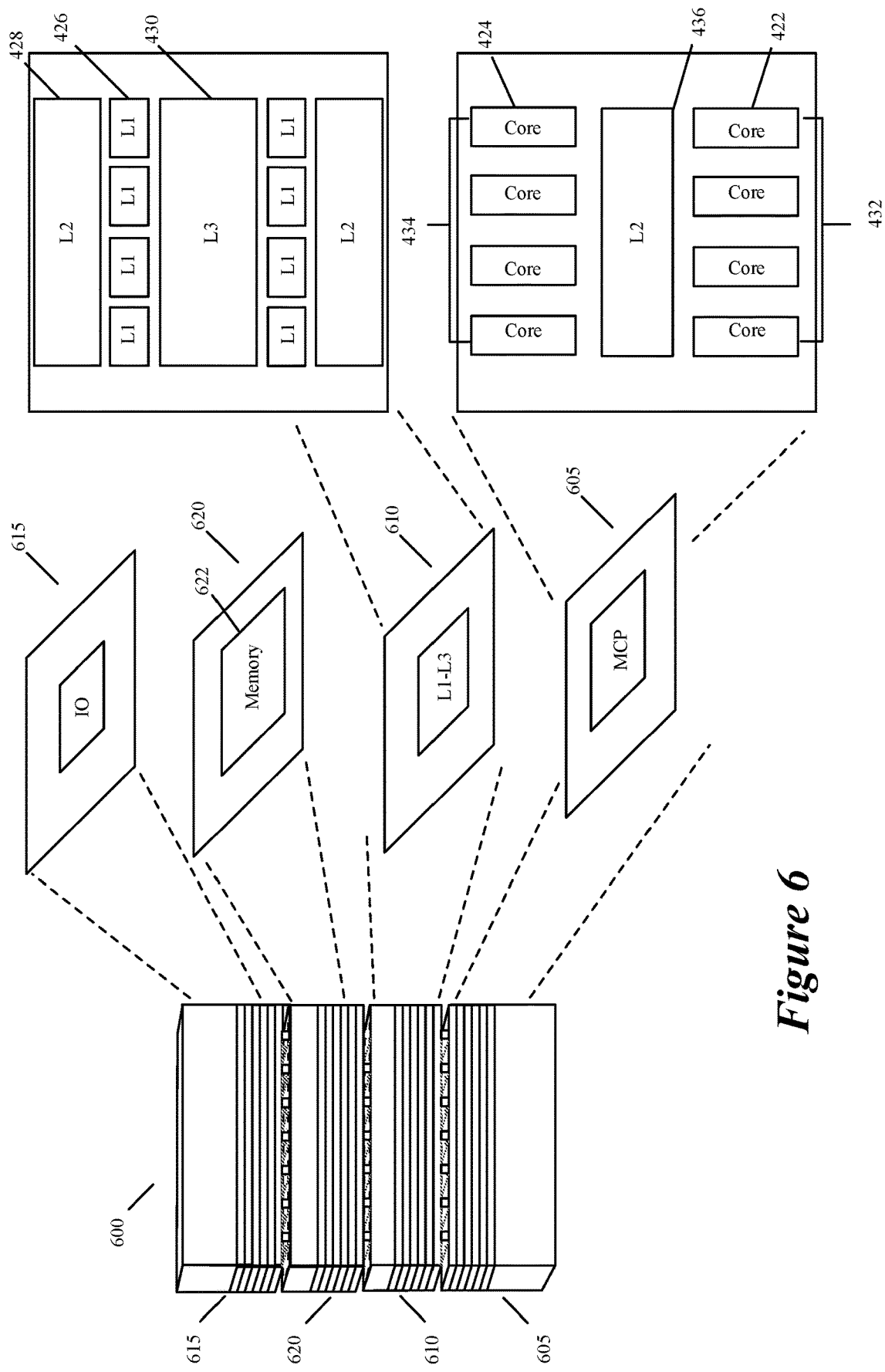
FIGS. 6-9 illustrate other 3D processors of some embodiments.
Figure 10:
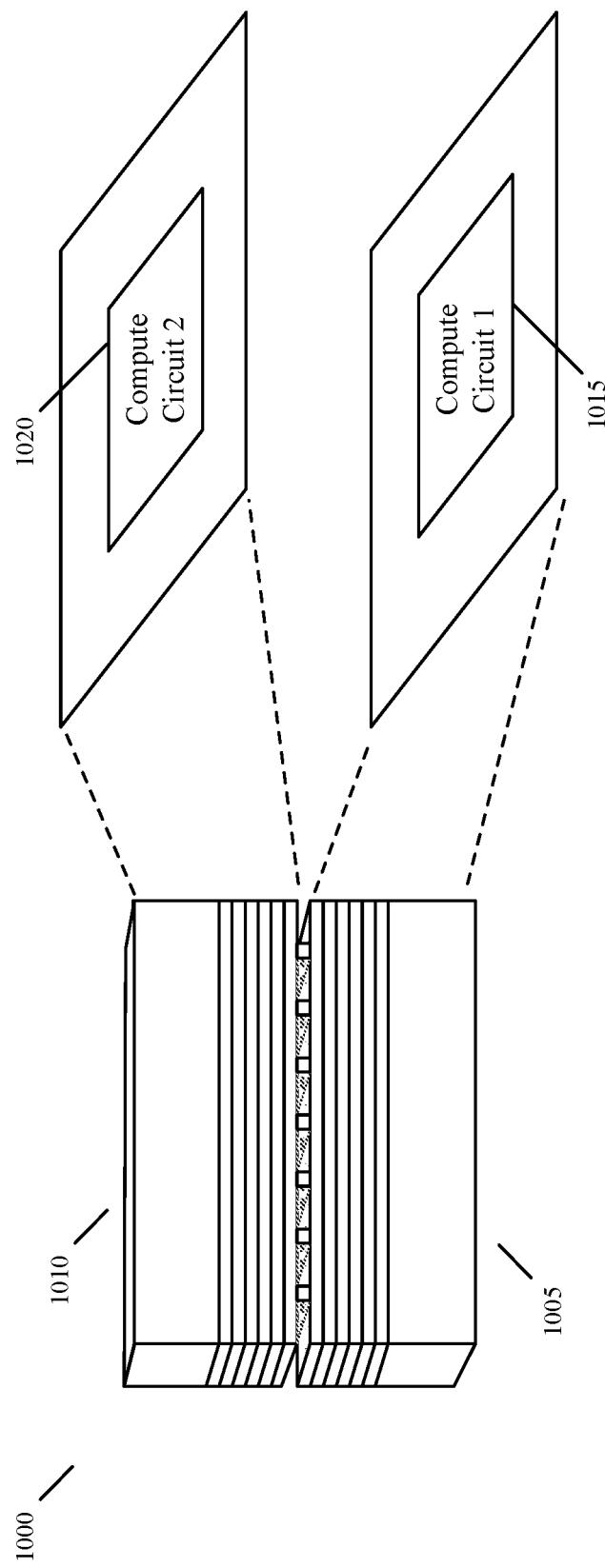
FIG. 10 illustrates that some embodiments place on different stacked dies two compute circuits that perform successive computations.
Figure 11:
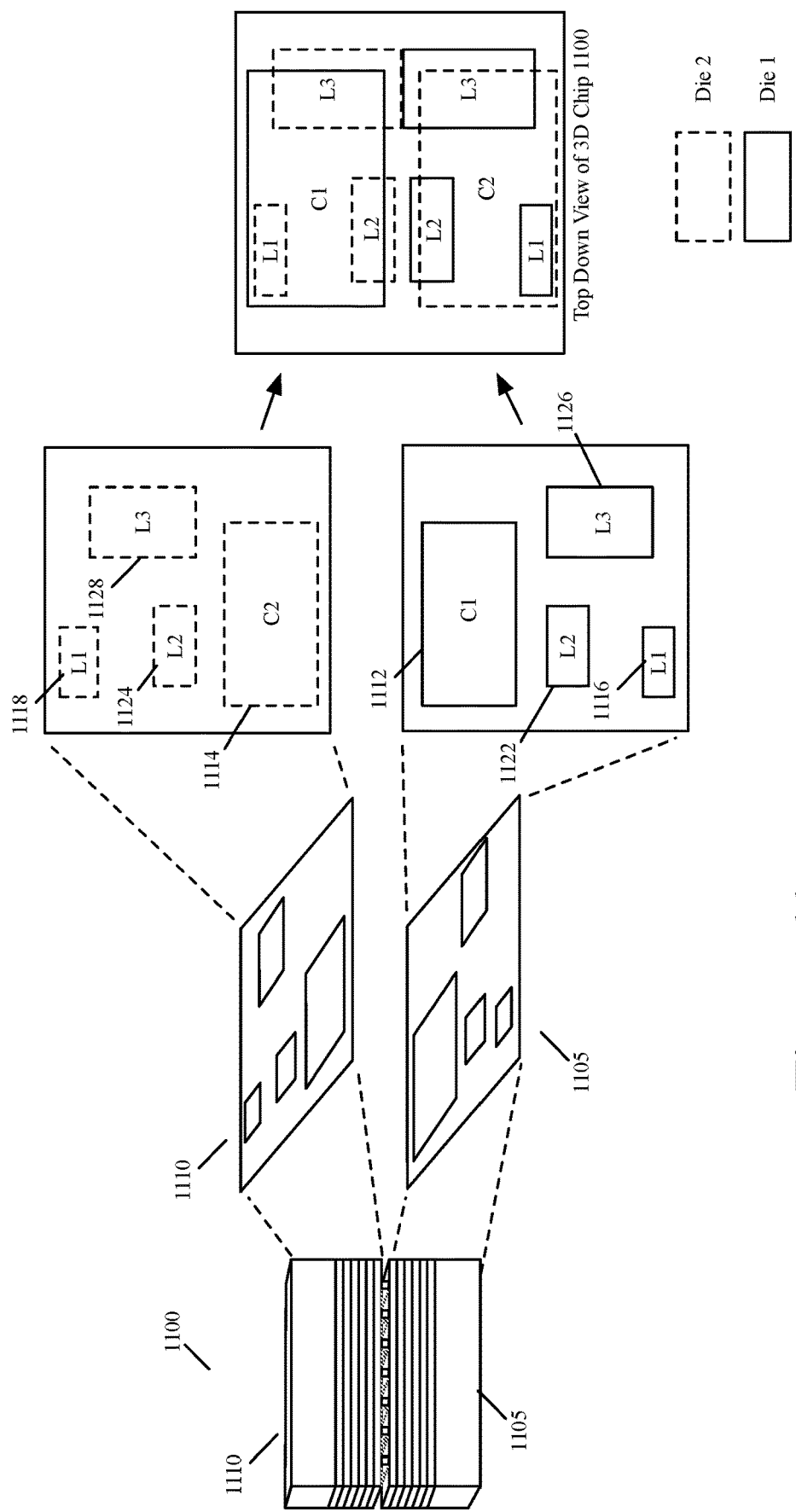
FIG. 11 illustrates an example of a high-performance 3D processor that has overlapping processor cores on different dies.
Figure 13:
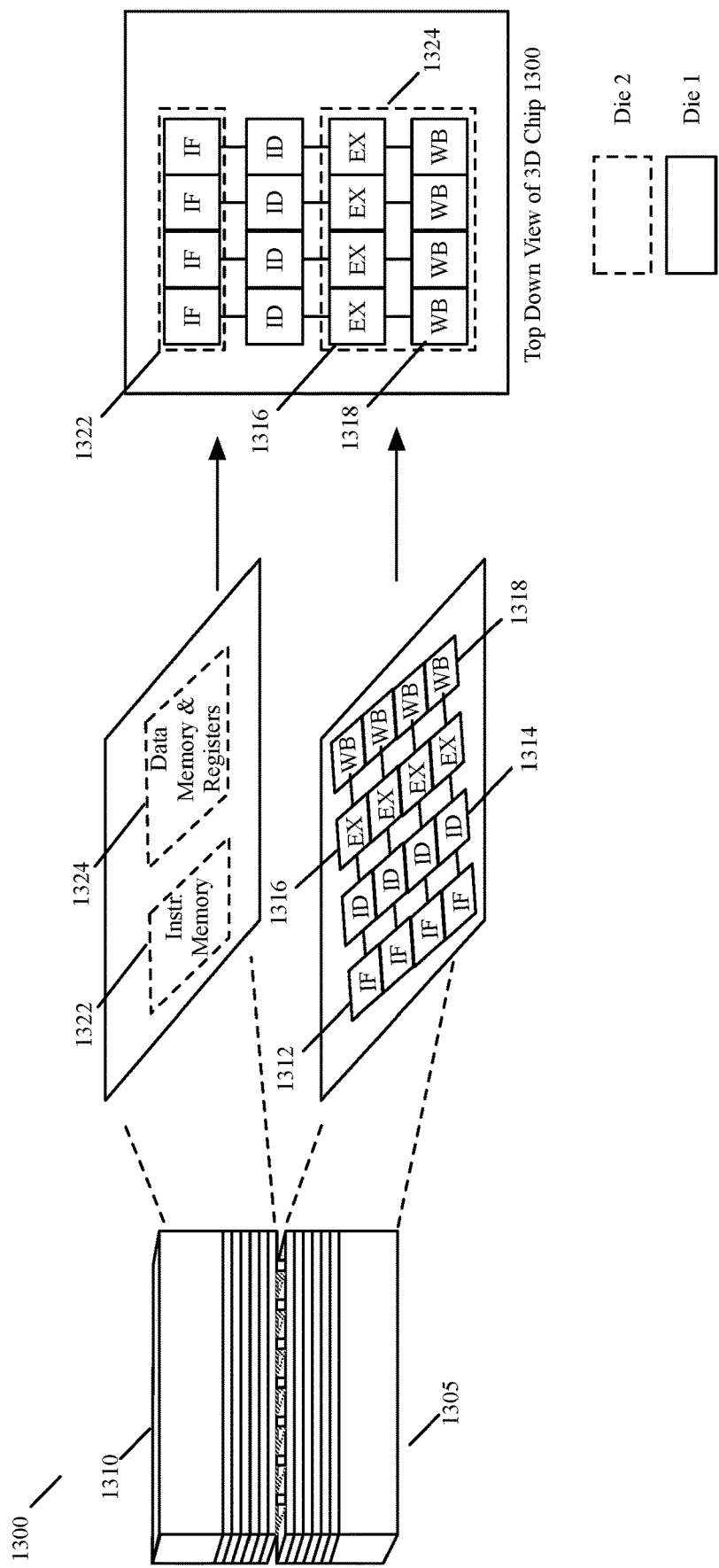
FIG. 13 illustrates an example of a 3D processor that has different parts of a processor core on two face-to-face mounted dies.

In FIG. 1, the overlapping circuit blocks 171-175 on the two dies 105 and 110 are different types of blocks in different embodiments. Examples of such blocks in some embodiments include memory blocks that store data, computational blocks that perform computations on the data, and I/O blocks that receive and output data from the 3D circuit 100. To provide more specific examples of overlapping circuit blocks, FIGS. 2, 4, and 6 illustrate several different overlapping memory blocks, computational blocks, and/or I/O blocks architectures of some embodiments. Some of these examples illustrate high performance 3D multi-core processors. FIGS. 10-11 then illustrate several examples of overlapping computation blocks, including different cores of a multi-core processor being placed on different IC dies. FIG. 13 illustrates an example of overlapping functional blocks of a processor core.

FIG. 2 illustrates an example of a high-performance 3D processor 200 that has a multi-core processor 250 on one die 205 and an embedded memory 255 on another die 210. As shown in this figure, the horizontal cross section of the multi-core processor has a substantially vertical overlaps with the horizontal cross section of the embedded memory. Also, in this example, the two dies 205 and 210 are face-to-face mounted through a direct bonding process, such as the DBI process. In other embodiments, these two dies can be face-to-back or back-to-back mounted.

As shown in FIG. 2, numerous z-axis connections 150 cross a direct bonding layer that bonds the two IC dies 205 and 210 in order to establish numerous signal paths between the multi-core processor 250 and the embedded memory 255. When the DBI process is used to bond the two dies 205 and 210, the z-axis connections can be in the range of 1,000 connections/mm$^2$ to 1,000,000 connections/mm$^2$. As such, the DBI z-axis connections allow a very large number of signal paths to be defined between the multi-core processor 250 and the embedded memory 255.

The DBI z-axis connections 150 also support very fast signal paths as the DBI connections are typically very short (e.g., are 0.2 μm to 2 μm). The overall length of the signal paths is also typically short because the signal paths are mostly vertical. The signal paths often rely on interconnect lines (on the interconnect layers) and vias (between the interconnect layers) to connect nodes of the processor 250 and the embedded memory 255. However, the signal paths are mostly vertical as they often connect nodes that are in the same proximate z-cross section. Given that the DBI connections are very short, the length of a vertical signal path mostly accounts for the height of the interconnect layers of the dies 205 and 210, which is typically in the single digit to low-double digit microns (e.g., the vertical signal paths are typically in the range of 10-20 μm long).

As z-axis connections provide short, fast and plentiful connections between the multi-core processor 250 and the embedded memory 255, they allow the embedded memory 255 to replace many of the external memories that are commonly used today in devices that employ multi-core processors. In other words, robust z-axis connections between vertically stacked IC dies enable next generation system on chip (SoC) architectures that combine the computational power of the fastest multi-core processors with large embedded memories that take the place of external memories.

Figure 3:
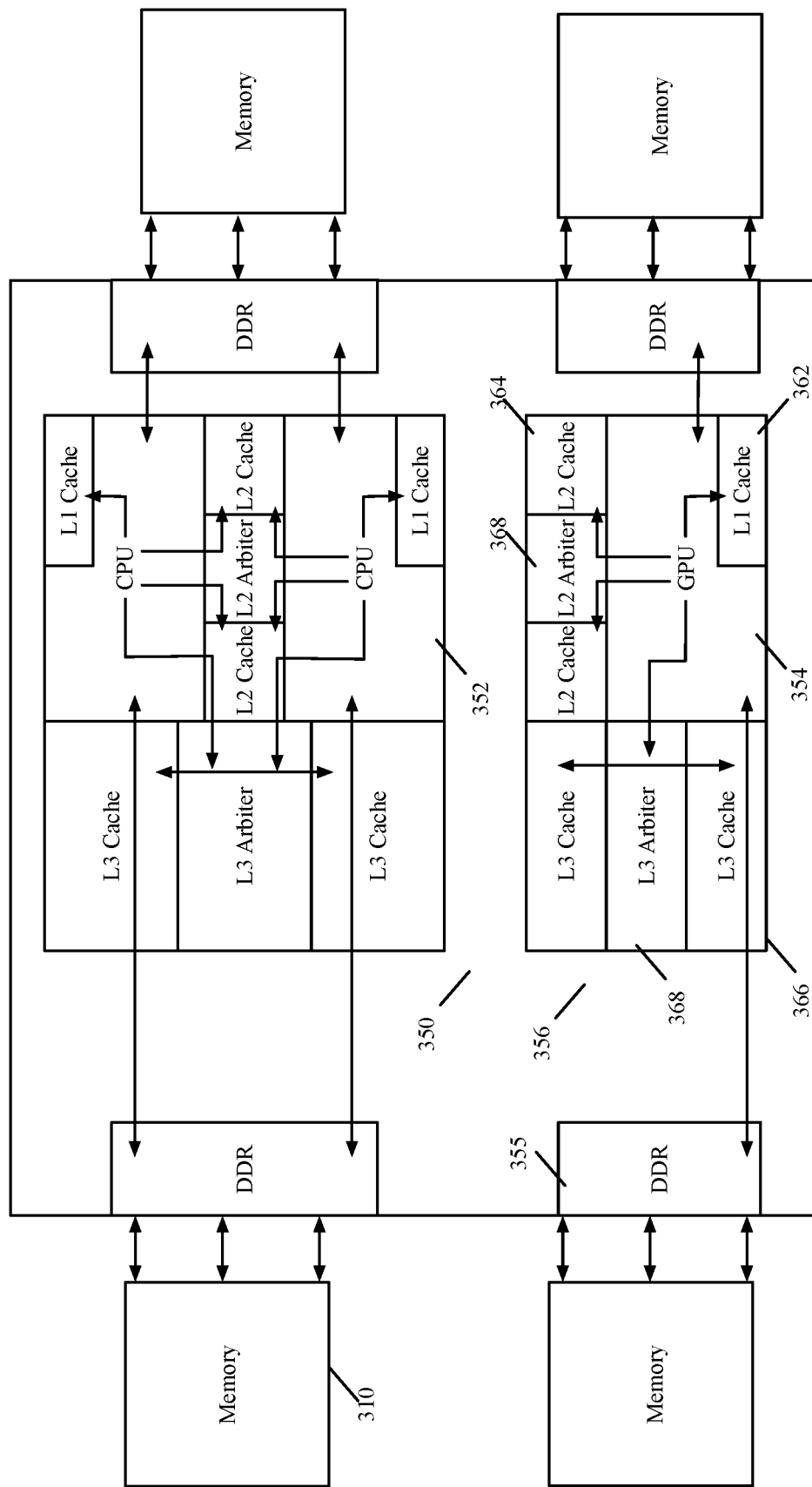
FIG. 3 illustrates how multi-core processors are commonly used today in many devices.

To better illustrate this, FIG. 3 illustrates how multi-core processors are commonly used today in many devices. As shown, a multi-core processor 350 in a device 305 typically communicates with multiple external memories 310 of the device 305 through an external I/O interface 355 (such as a double data rate (DDR) interface). As further show, the multi-core processor has multiple general processing cores 352 and one or more graphical processing cores 354 that form a graphical processing unit 356 of the processor 350.

Each of the processing cores has its own level 1 (L1) cache 362 to store data. Also, multiple level 2 (L2) caches 364 are used to allow different processing cores to store their data for access by themselves and by other cores. One or more level 3 (L3) caches 366 are also used to store data retrieved from external memories 310 and to supply data to external memories 310. The different cores access the L2 and L3 caches through arbiters 368. As shown, I/O interfaces 355 are used to retrieve data for L3 cache 366 and the processing cores 352 and 354. L1 caches typically have faster access times than L2 caches, which, in turn, have faster access times often than L3 caches.

The I/O interfaces consume a lot of power and also have limited I/O capabilities. Often, I/O interfaces have to serialize and de-serialize the output data and the input data, which consumes power and also restricts the multi-core processors input/output. Also, the architecture illustrated in FIG. 3 requires enough wiring to route the signals between the various components of the multi-core processor and the I/O interfaces.

The power consumption, wiring and processor's I/O bottleneck is dramatically improved by replacing the external memories with one or more embedded memories 255 that are vertically stacked with the multi-core processor 250 in the same IC package. This arrangement dramatically reduces the length of the wires needed to carry signals between the multi-core processor 250 and its external memory (which in FIG. 2 is the embedded memory 255). Instead of being millimeters in length, this wiring is now in the low microns. This is a 100-1000 times improvement in wirelength.

The reduction in wirelength allows the 3D processor 200 of FIG. 2 to have much lower power consumption than the present day design of FIG. 3. The 3D processor's stacked design also consumes much less power as it foregoes the low throughput, high power consuming I/O interface between the external memories 310 and the multi-core processor 350 with plentiful, short z-axis connections between the embedded memory 255 and the multi-core processor 250. The 3D processor 200 still needs an I/O interface on one of its dies (e.g., the first die 205, the second die 210 or another stacked die, not shown), but this processor 200 does not need to rely on it as heavily to input data for consumption as a large amount of data (e.g., more than 200 MB, 500 MB, 1 GB, etc.) can be stored in the embedded memory 255.

The stacked design of the 3D processor 200, FIG. 2, also reduces the size of the multi-core processor by requiring less I/O interface circuits and by placing the I/O interface circuits 257 on the second die 210. In other embodiments, the I/O interface circuits 257 are on the first die 205, but are fewer and/or smaller circuits. In still other embodiments, the I/O interface circuits are placed on a third die stacked with the first and second dies, as further described below.

The stacked design of the 3D processor 200 also frees up space in the device that uses the multi-core processor as it moves some of the external memories to be in the same IC chip housing as the multi-core processor. Examples of memories that can be embedded memories 255 stacked with the multi-core processor 250 include any type of memory, such as SRAM (static random access memory), DRAM (dynamic random access memory), MRAM (magnetoresistive random access memory), TCAM (ternary content addressable random access memory), NAND Flash, NOR Flash, RRAM (resistive random access memory), PCRAM (phase change random access memory), etc.

Even though FIG. 2 illustrates one embedded memory on the second die 210, multiple embedded memories are defined on the second die 210 in some embodiments, while multiple embedded memories are defined on two or more dies that are vertically stacked with the first die 205 that contains the multi-core processor 250. In some embodiments that use multiple different embedded memories, the different embedded memories all are of the same type, while in other embodiments, the different embedded memories are different types (e.g., some are SRAMs while others are NAND/NOR Flash memories). In some embodiments, the different embedded memories are defined on the same IC die, while in other embodiments, different embedded memories are defined on different IC dies.

FIG. 2 illustrates that in some embodiments the multi-core processor 250 has the similar components (e.g., multiple general processing cores 270, L1, L2, and L3 caches 272, 274, and 276, cache arbiters 278 and 280, graphical processing core 282, etc.) like other multi-processor cores. However, in the 3D processor 200, the I/O interface circuits 257 for the multi-core processor 250 are placed on the second die 205, as mentioned above.

The I/O circuits 257 write data to the embedded memory 255 from external devices and memories, and reads data from the embedded memory 255 for the external devices and memories. In some embodiments, the I/O circuit 255 can also retrieve data from external devices and memories for the L3 cache, or receive data from the L3 cache for external devices and memories, without the data first going through the embedded memory 255. Some of these embodiments have a direct vertical (z-axis) bus between the L3 cache and the I/O circuit 257. In these or other embodiments, the first die 205 also includes I/O circuits as interfaces between the I/O circuit 255 and the L3 cache 276, or as interfaces between the L3 cache 276 and the external devices/memories.

Instead of, or in conjunction with, placing I/O circuits on a different die than the rest of the multi-core processor, some embodiments place other components of a multi-core processor on different IC dies that are placed in a vertical stack. For instance, FIG. 4 illustrates an example of a 3D processor 400 that is formed by vertically stacking three dies 405, 410 and 415, with the first die 405 including multiple processor cores 422 and 424 of a multi-core processor, the second die 410 including L1-L3 caches 426, 428 and 430 for the processing cores, and the third die 415 including I/O circuits 435. In this example, the first and second dies 405 and 410 are face-to-face mounted (e.g., through a direct bonding process, such as a DBI process), while the second and third dies 410 and 415 are back-to-face mounted.

In this example, the processor cores are in two sets of four cores 432 and 434. As shown, each core on the first die 405 overlaps (1) with that core's L1 cache 426 on the second die 410, (2) with one L2 cache 428 on the second die 410 that is shared by the three other cores in the same four-core set 432 or 434, and (3) with the L3 cache 430 on the second die 410. In some embodiments, numerous z-axis connections (e.g., DBI connections) establish numerous signal paths between each core and each L1, L2, or L3 cache that it overlaps. These signal paths are also established by interconnect segments on the interconnect layers, and vias between the interconnect layers, of the first and second dies.

In some embodiments, some or all of the cache memories (e.g., the L2 and L3 caches 428 and 430) are multi-ported memories that can be simultaneously accessed by different cores. One or more of the cache memories in some embodiments include cache arbiter circuits that arbitrate (e.g., control and regulate) simultaneous and at time conflicting access to the memories by different processing cores. As shown, the 3D processor 400 also includes one L2 cache memory 436 on the first die 405 between the two four-core sets 432 and 434 in order to allow data to be shared between these sets of processor cores. In some embodiments, the L2 cache memory 436 includes a cache arbiter circuit (not shown). In other embodiments, the 3D processor 400 does not include the L2 cache memory 436. In some of these embodiments, the different processor core sets 432 and 434 share data through the L3 cache 430.

Figure 5:
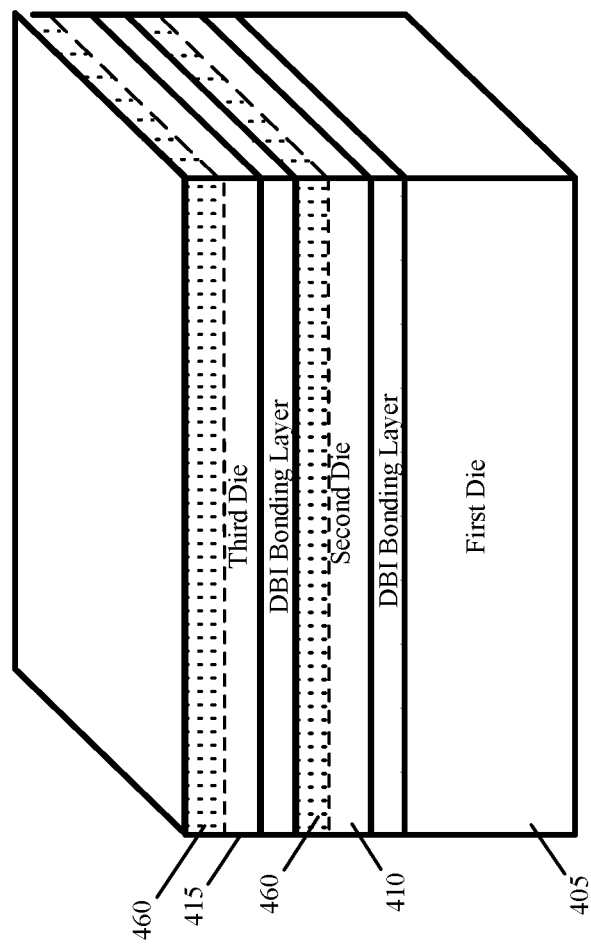
FIG. 5 illustrates three vertically stacked dies with the backside of the second die thinned through a thinning process after face-to-face bonding the first and second dies but before face-to-back mounting the third die to the second die.

The L3 cache 430 stores data for all processing cores 422 and 424 to access. Some of this data is retrieved from external memories (i.e., memories outside of the 3D processor 400) by the I/O circuit 435 that is defined on the third die 415. The third die 415 in some embodiments is face-to-back mounted with the second die. To establish this mounting, TSVs 460 are defined through the second die's substrate, and these TSVs electrically connect (either directly or through interconnect segments defined on the back side of the second die) to direct bonded connections that connect the backside of the second die to the front side of the third die (i.e., to the top interconnect layer on the front side of the third die). As shown in FIG. 5, the backside of the second die is thinned through a thinning process after face-to-face bonding the first and second dies but before face-to-back mounting the third die to the second die. This thinning allows the TSVs through the second die's substrate to be shorter. The shorter length of the TSVs, in turn, allows the TSVs to have smaller cross sections and smaller pitch (i.e., smaller center-to-center distance to neighboring TSVs), which thereby improves their density.

Most of the signal paths between the second and third dies 410 and 415 are very short (e.g., typically in the range of 10-20 μm long) as they mostly traverse in the vertical direction through the thinned second die's substrate and third die's interconnect layers, which have relatively short heights. In some embodiments, a large number of short, vertical signal paths are defined between the L3 cache 430 on the second die 410 and the I/O circuit 435 on the third die 415. These signal paths use (1) direct-bonded connections between the top interconnect layer of the third die 415 and the backside of the second die 410, (2) TSVs 460 through the second die's substrate, and (3) vias between the interconnect layers, and interconnect segments on the interconnect layers, of the second and third die. The number and short length of these signal paths allow the I/O circuit to rapidly write to and read from the L3 cache.

The signal paths between the first and second dies 405 and 410 use (1) direct-bonded connections between the top interconnect layers of the first and second dies 405 and 410, and (2) vias between the interconnect layers, and interconnect segments on the interconnect layers, of the first and second dies 405 and 410. Most of these signal paths between the first and second dies 405 and 410 are also very short (e.g., typically in the range of 10-20 μm long) as they mostly traverse in the vertical direction through the first and second dies' interconnect layers, which have relatively short heights. In some embodiments, a large number of short, vertical signal paths are defined between the processing cores on the first die 405 and their associated L1-L3 caches.

In some embodiments, the processor cores use these fast and plentiful signal paths to perform very fast writes and reads of large data bit sets to and from the L1-L3 cache memories. The processor cores then perform their operations (e.g., their instruction fetch, instruction decode, arithmetic logic, and data write back operations) based on these larger data sets, which in turn allows them to perform more complex instruction sets and/or to perform smaller instruction sets more quickly.

FIG. 6 illustrates another 3D processor 600 of some embodiments. This processor 600 combines features of the 3D processor 200 of FIG. 2 with features of the 3D processor 400 of FIG. 4. Specifically, like the processor 400, the processor 600 places multiple processor cores 422 and 424 on a first die 605, L1-L3 caches 426, 428 and 430 on a second die 610, and I/O circuits 435 on a third die 615. However, like the processor 200, the processor 600 also has one die with an embedded memory 622. This embedded memory is defined on a fourth die 620 that is placed between the second and third dies 610 and 615.

In FIG. 6, the first and second dies 605 and 610 are face-to-face mounted (e.g., through a direct bonding process, such as a DBI process), the fourth and second dies 620 and 610 are face-to-back mounted, and the third and fourth dies 615 and 620 are face-to-back mounted. To establish the face-to-back mounting, TSVs 460 are defined through the substrates of the second die and third dies. The TSVs through the second die 610 electrically connect (either directly or through interconnect segments defined on the back side of the second die) to direct bonded connections that connect the backside of the second die 610 to the front side of the fourth die 620, while the TSVs through the fourth die 620 electrically connect (either directly or through interconnect segments defined on the back side of the second die) to direct bonded connections that connect the backside of the fourth die 620 to the front side of the third die 615.

To allow these TSVs to be shorter, the backside of the second die is thinned through a thinning process after face-to-face bonding the first and second dies but before face-to-back mounting the fourth die 620 to the second die 610. Similarly, the backside of the fourth die 620 is thinned through a thinning process after face-to-back mounting the fourth and second dies 620 and 610 but before face-to-back mounting the third die 615 to the fourth die 620. Again, the shorter length of the TSVs allows the TSVs to have smaller cross sections and smaller pitch (i.e., smaller center-to-center distance to neighboring TSVs), which thereby improves their density.

As in FIG. 4, the L3 cache 430 in FIG. 6 stores data for all processing cores 422 and 424 to access. However, in FIG. 6, the L3 cache does not connect to the I/O circuits 435 but rather connects to the embedded memory 622 on the fourth die through vertical signal paths. In this design, the embedded memory 622 connects to the I/O circuits 435 on the third die 615 through vertical signal paths. In some embodiments, the vertical signal paths between the second and fourth dies 610 and 620 and between the fourth and third dies 620 and 615 are established by z-axis direct bonded connections and TSVs, as well as interconnect segments on the interconnect layers and vias between the interconnect layers. Most of these signal paths are very short (e.g., typically in the range of 10-20 μm long) as they are mostly vertical and the height of the thinned substrates and their associated interconnect layers is relatively short.

Like the embedded memory 255 of FIG. 2, the embedded memory 622 is a large memory (e.g., is larger than 200 MB, 500 MB, 1 GB, etc.) in some embodiments. As such, the embedded memory in some embodiments can replace one or more external memories that are commonly used today in devices that employ multi-core processors. Examples of the embedded memory 622 include SRAM, DRAM, MRAM, NAND Flash, NOR Flash, RRAM, PCRAM, etc. In some embodiments, two or more different types of embedded memories are defined on one die or multiple dies in the stack of dies that includes one or more dies on which a multi-core processor is defined.

Through numerous short, vertical signal paths, the embedded memory 622 receives data from, and supplies data to, the I/P circuit 435. Through these signal paths, the I/O circuit 435 writes data to the embedded memory 622 from external devices and memories, and reads data from the embedded memory 622 for the external devices and memories. In some embodiments, the I/O circuit 435 can also retrieve data from external devices and memories for the L3 cache, or receive data from the L3 cache for external devices and memories, without the data first going through the embedded memory 622. Some of these embodiments have a direct vertical (z-axis) bus between the L3 cache and the I/O circuit 435. In these or other embodiments, the second die 610 and/or fourth die 620 also include I/O circuits as interfaces between the I/O circuit 435 and the L3 cache 430, or as interfaces between the L3 cache 430 and the external devices/memories.

Figure 7:
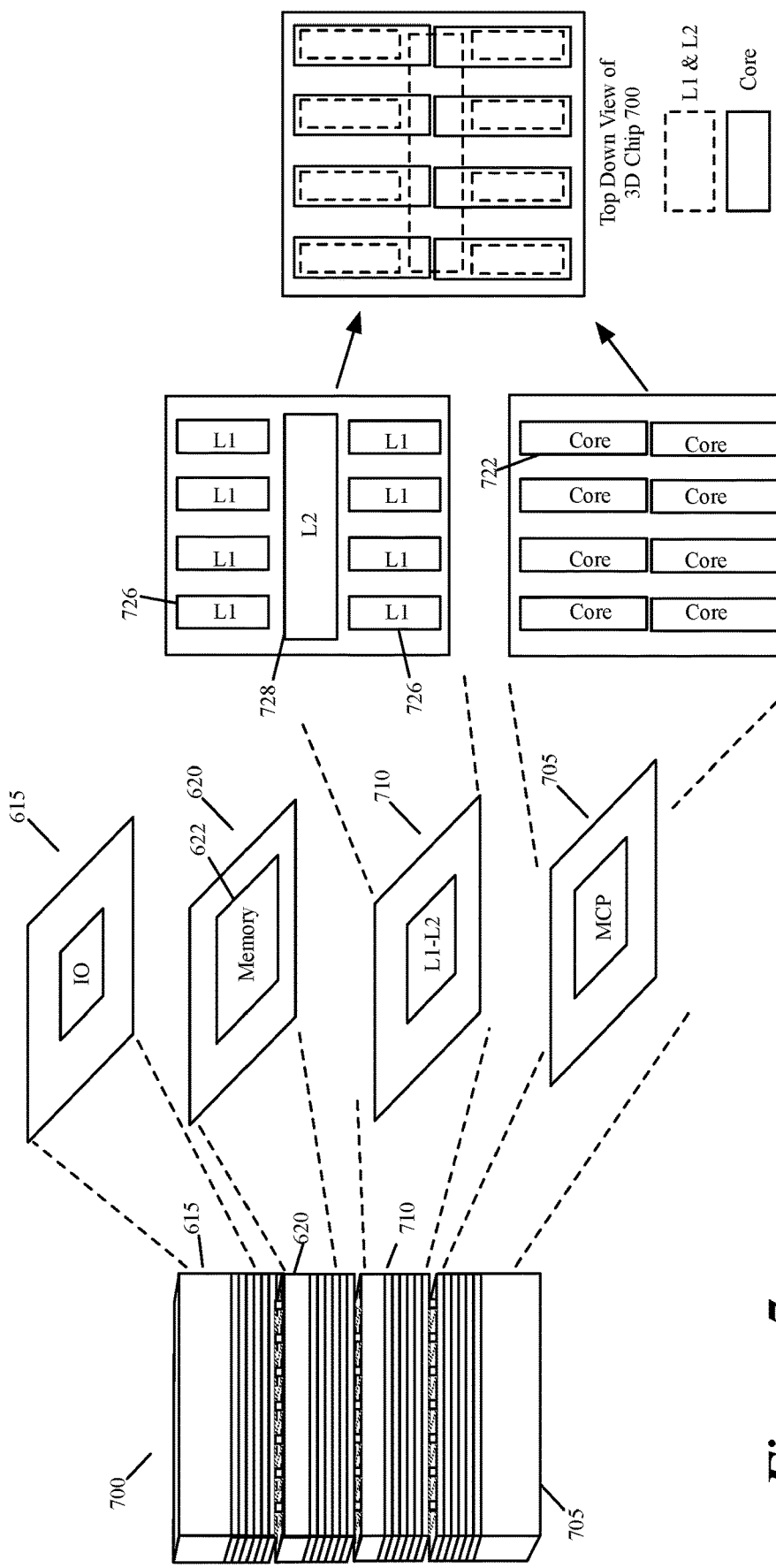

FIG. 7 illustrates yet another 3D processor 700 of some embodiments. This processor 700 is identical to the processor 600 of FIG. 6, except that it only has two layers of caches, L1 and L2, on a second die 710 that is face-to-face mounted on a first die 705 that has eight processor cores 722. As shown, each L1 cache 726 overlaps just one core 722. Unlike the L1 caches 726, the L2 cache 728 is shared among all the cores 722 and overlaps each of the cores 722. In some embodiments, each core connects to each L1 or L2 cache that it overlaps through (1) numerous z-axis DBI connections that connect the top interconnect layers of the dies 705 and 721, and (2) the interconnects and vias that carry the signals from these DBI connections to other metal and substrate layers of the dies 705 and 710. The DBI connections in some embodiments allow the data buses between the caches and the cores to be much wider and faster than traditional data buses between the caches and the cores.

In some embodiments, L1 caches are formed by memories that can be accessed faster (i.e., have faster read or write times) than the memories that are used to form L2 caches. Each L1 cache 726 in some embodiments is composed of just one bank of memories, while in other embodiments it is composed of several banks of memories. Similarly, the L2 cache 728 in some embodiments is composed of just one bank of memories, while in other embodiments it is composed of several banks of memories. Also, in some embodiments, the L1 caches 726 and/or L2 cache 728 are denser than traditional L1 and L2 caches as they use z-axis DBI connections to provide and receive their signals to and from the overlapping cores 722. In some embodiments, the L1 and L2 caches 726 and 728 are much larger than traditional L1 and L2 caches as they are defined on another die than the die on which the cores are defined, and hence face less space restrictions on their placement and the amount of space that they consume on the chip.

Figure 8:
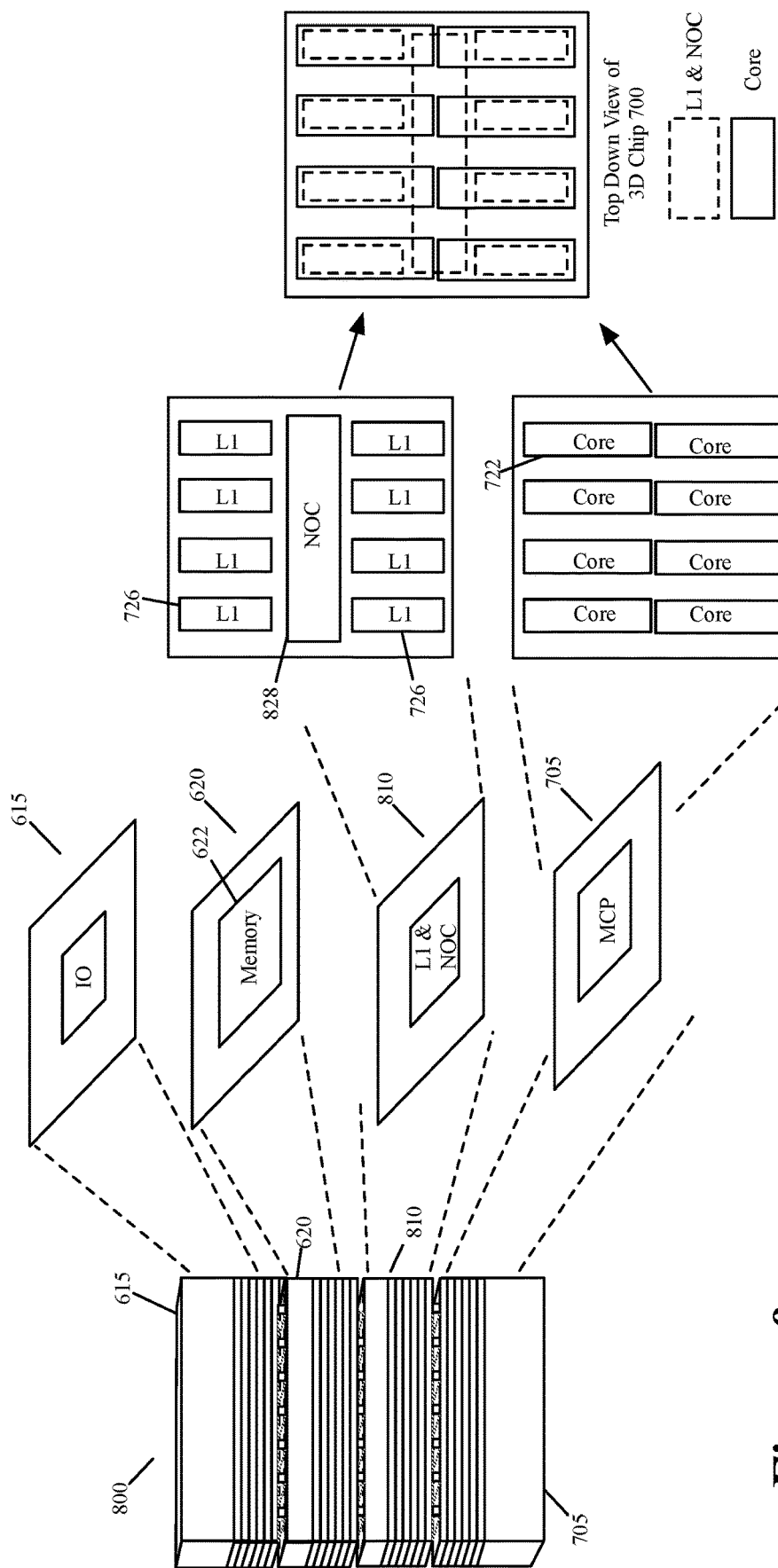

Other embodiments use still other architectures for 3D processors. For example, instead of using just one L2 cache 728, some embodiments use two or four L2 caches that overlap four cores (e.g., the four left cores 726 and the four right cores 726) or two cores (e.g., one of the four pairs of vertically aligned cores 722). FIG. 8 illustrates another 3D processor 800 of some embodiments. This processor 800 is identical to the processor 700 of FIG. 7, except that it does not have the L2 cache 728. In place of this L2 cache, the processor 900 has a network on chip (NOC) 8028 on the die 810, which is face-to-face mounted to the die 705 through a DBI bonding process.

In some embodiments, the NOC 828 is an interface through which the cores 722 communicate. This interface includes one or more buses and associated bus circuitry. The NOC 828 in some embodiments also communicatively connects each core to the L1 caches that overlap the other cores. Through this NOC, a first core can access data stored by a second core in the L1 cache that overlap the second core. Also, through this NOC, a first core in some embodiments can store data in the L1 cache that overlaps a second core. In some embodiments, an L1 and L2 cache overlaps each core 722, and the NOC 828 connects the cores to L2 caches of other cores, but not to the L1 caches of these cores. In other embodiments, the NOC 828 connects the cores to both L1 and L2 caches that overlap other cores, as well as to the other cores.

Figure 9:
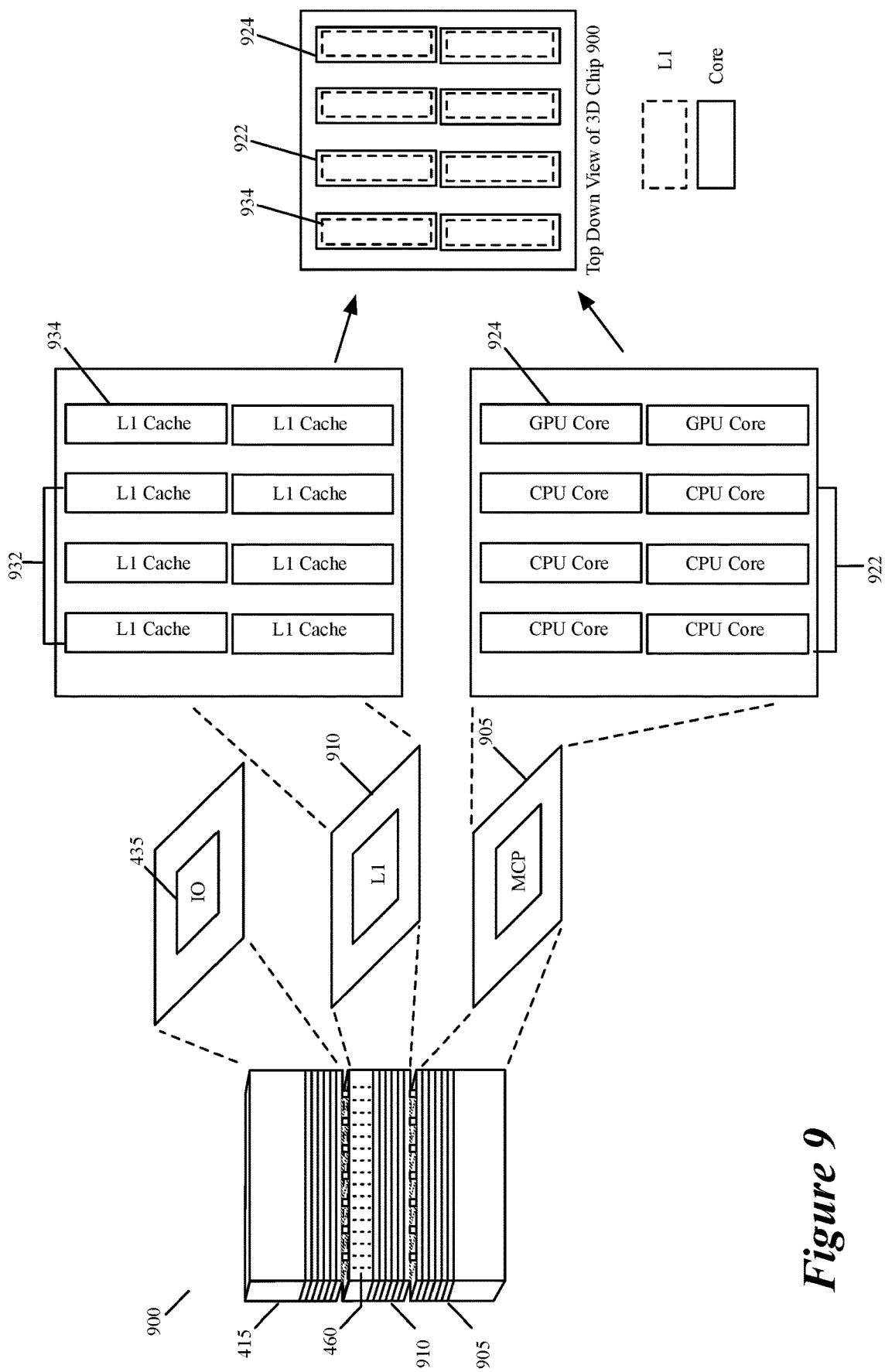

FIG. 9 illustrates yet another 3D processor 900 of some embodiments. This processor 900 is identical to the processor 400 of FIG. 4, except that it only has one L1 cache 932 on a die 910 for each of six CPU (central processing unit) cores 922 and one L1 cache 934 for each of two GPU (graphics processing unit) cores 924 that are defined on a die 905 that is face-to-face mounted to the die 910 through a DBI bonding process. The processor 900 does not use layers 2 and 3 caches as it uses large L1 caches for its CPU and GPU cores. The L1 caches can be larger than traditional L1 caches as they are defined on another die than the die on which the cores are defined, and hence face less space restrictions on their placement and the amount of space that they consume on the chip.

In FIG. 9, the processor 900 has its I/O interface defined on a third die 415 that is face-to-back mounted on the die 910. In other embodiments, the processor 900 does not include the third die 415, but just includes the first and second dies 905 and 910. In some of these embodiments, the I/O interface of the processor 900 is defined on the first and/or second dies 905 and 910. Also, in other embodiments, one L1 cache 932 is shared across multiple CPU cores 922 and/or multiple GPU cores 924.

FIG. 10 illustrates that some embodiments place on different stacked dies two compute circuits that perform successive computations. A compute circuit is a circuit that receives a multi-bit value as input and computes a multi-bit value as output based on the received input. In FIG. 10, one compute circuit 1015 is defined on a first die 1005 while the other compute circuit 1020 is defined on a second die 1010.

The first and second dies are face-to-face mounted through a direct bonding process (e.g., a DBI process). This mounting defines numerous z-axis connections between the two dies 1005 and 1010. Along with interconnect line on the interconnect layers, and vias between the interconnect layers, of the two dies, the z-axis connections define numerous vertical signal paths between the two compute circuits 1015 and 1020. These vertical signal paths are short as they mostly traverse in the vertical direction through the die interconnect layers, which are relatively short. As they are very short, these vertical signal paths are very fast parallel paths that connect the two compute circuit 1015 and 1020.

In FIG. 10, the first compute circuit 1015 receives a multi-bit input value 1030 and computes a multi-bit output value 1040 based on this input value. In some embodiments, the multi-bit input value 1030 and/or output value 1040 are large bit values, e.g., 32 bits, 64 bits, 128 bits, 256 bits, 512 bits, 1024 bits, etc. Through the vertical signal paths between these two compute circuits, the first compute circuit 1015 provides its multi-bit output value 1040 as the input value to the compute circuit 1020. Based on this value, the compute circuit 1020 computes another multi-bit output value 1045.

Given the large number of vertical signal paths between the first and second compute circuits 1015 and 1020, large number of bits can be transferred between these two circuits 1015 and 1020 without the need to use serializing and de-serializing circuits. The number of the vertical signal paths and the size of the exchanged data also allow many more computations to be performed per each clock cycle. Because of the short length of these vertical signal paths, the two circuits 1015 and 1020 can exchange data within one clock cycle. When two computation circuits are placed on one die, it sometimes can take 8 or more clock cycles for signals to be provided from one circuit to another because of the distances and/or the congestion between the two circuits.

In some embodiments, the two overlapping computation circuits on the two dies 1005 and 1010 are different cores of a multi-core processor. FIG. 11 illustrates an example of a high-performance 3D processor 1100 that has overlapping processor cores on different dies. In this example, two dies 1105 and 1110 are face-to-face mounted through a direct bonding process (e.g., the DBI process). The first die 1105 includes a first processor core 1112, while the second die 1110 includes a second processor core 1114.

The first die 1105 also includes an L1 cache 1116 for the second core 1114 on the second die 1110, and L2 and L3 caches 1122 and 1126 for both cores 1112 and 1114. Similarly, the second die 1110 also includes an L1 cache 1118 for the first core 1112 on the first die 1105, and L2 and L3 caches 1124 and 1128 for both cores 1112 and 1114. As shown, each core completely overlaps its corresponding L1 cache, and connects to its L1 cache through numerous vertical signal paths that are partially defined by z-axis connections between the top two interconnect layers of the dies 1105 and 1110. As mentioned above, such vertical signal paths are also defined by (1) vias between interconnect layers of each die, and/or (3) interconnect segments on interconnect layers of each die.

Each core on one die also overlaps with one L2 cache and one L3 cache on the other die and is positioned near another L2 cache and another L3 cache on its own die. Each L2 and L3 cache 1122-826 can be accessed by each core 1112 or 1114. Each core accesses an overlapping L2 or L3 cache through numerous vertical signal paths that are partially defined by z-axis connections between the top two interconnect layers of the dies 1105 and 1110 and by (1) vias between interconnect layers of each die, and/or (3) interconnect segments on interconnect layers of each die.

Each core can also access an L2 or L3 cache on its own die through signal paths that are defined by visa between interconnect layers, and interconnect segments on interconnect layers, of its own die. In some embodiments, when additional signal paths are needed between each core and an L2 or L3 cache on its own die, each core also connects to such L2 or L3 cache through signal paths that are not only defined by vias between interconnect layers, and interconnect segments on interconnect layers, of its own die, but by vias between interconnect layers and interconnect segments on interconnect layers of the other die.

Other embodiments, however, do not use signal paths that traverse through the other die's interconnect layers to connect a core with an L2 cache or an L3 cache on its own die, because such signal paths might have different delay (i.e., a greater delay) than signal paths between this core and this cache that only use the interconnect layers of the core's own die. On the other hand, given the very short length of the z-axis connections, other embodiments use signal paths defined through the other die's interconnect layers (e.g., through its top interconnect layers) when the difference in the signal path delay is very small (as compared to the speed of the signal paths that only use the interconnect layers of the core's die).

The 3D architecture illustrated in FIG. 11 dramatically increases the number of connections (through vertical signal paths) between each core 1112 or 1114 and its corresponding L1, L2 and L3 caches. With this increase, each core 1112 or 1114 retrieves much larger sets of data bits and performs more complex operations faster with such larger sets of data bits. In some embodiments, each core uses wider instruction and data buses in its pipelines as it can retrieve wider instructions and data from overlapping memories. In these or other embodiments, each core has more pipelines that perform more operations in parallel as the core can retrieve more instruction and data bits from the overlapping memories.

In some embodiments, each core on one die only uses the L2 cache or L3 cache on the other die (i.e., only uses the L2 or L3 cache that vertically overlaps the core) in order to take advantage of the large number of vertical signal paths between it and the overlapping L2 cache. Each core in some of these embodiments stores a redundant copy of each data, which it stores in its own overlapping cache (e.g., its own overlapping L2 cache) in the corresponding cache (e.g., in the other L2 cache) that is defined on the core's own die, so that the data is also available for the other core. In some of these embodiments, each core reaches the cache on its own die through signal paths that are not only defined through the interconnect lines and vias on the core's die, but also defined through interconnect lines and vias of the other die.

Figure 12:
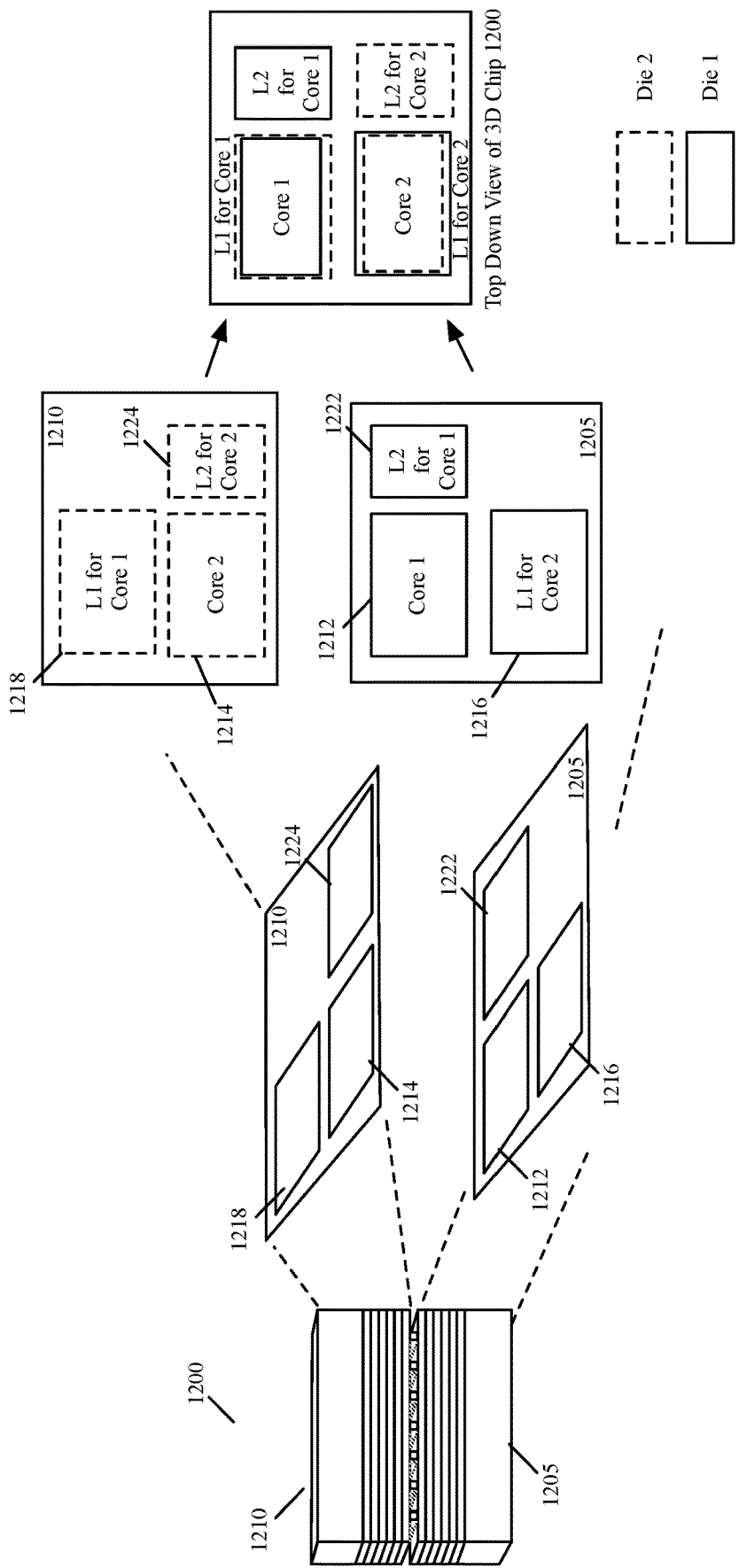
FIG. 12 illustrates another example of a high-performance 3D processor that has a processor core on one die overlap with a cache on another die.

FIG. 12 illustrates another example of a high-performance 3D processor 1200 that has a processor core on one die overlap with a cache on another die. In this example, two dies 1205 and 1210 are face-to-face mounted through a direct bonding process (e.g., the DBI process). The first die 1205 includes a first processor core 1212, while the second die 1210 includes a second processor core 1214. The first die 1205 includes an L1 cache 1216 for the second processor core 1214 defined on the second die 1210, while the second die 1210 includes an L1 cache 1218 for the first processor core 1212 defined on the first die 1205.

In this example, the cross-section of each L1 cache on one die completely overlaps the cross-section of the corresponding core on the other die. This ensures the largest region for defining z-axis connections (e.g., DBI connections) in the overlapping regions of each core and its corresponding L1 cache. These z-axis connections are very short and hence can be used to define a very fast bus between each core and its corresponding L1 cache. Also, when high density z-axis bonding is used (e.g., when DBI is used), this z-axis bus can be wide and it can be defined wholly within the x-y cross-section of the core and its L1 cache, as further described below. By being wholly contained within this cross-section, the z-axis bus would not consume routing resources around the core and its L1 cache. Also, the speed and width of this bus allows the bus to have a very high throughput bandwidth, which perfectly complements the high speed of the L1 cache.

As shown in FIG. 12, the 3D processor 1200 defines an L2 cache for each core on the same die on which the core is defined. In some embodiments, each core can access the other core's L2 cache through z-axis connections established through the face-to-face bonding of the two IC dies. Also, due to the size of the L1 cache, the 3D process 1200 in some embodiments does not use an L3 cache.

In some embodiments, different components of a processor core of a multi-processor core are placed on different dies. FIG. 13 illustrates an example of a 3D processor 1300 that has different parts of a processor core on two face-to-face mounted dies 1305 and 1310. In this example, the first die 1305 includes multiple pipeline 1390, with each pipeline having an instruction fetch (IF) unit 1312, an instruction decode unit 1314, an execution unit 1316 and a write-back unit 1318. The second die includes the instruction memory 1322 and data registers and memories 1324.

As shown, the instruction memory 1322 on the second die overlaps with the IF units 1312 on the first die 1305. Also, the data registers and memories 1324 on the second die overlap with the execution units 1316 and the write-back units. Numerous vertical signal paths are defined between overlapping core components by the z-axis connections between the top two interconnect layers of the dies 1305 and 1310, and by (1) vias between interconnect layers of each die 1305 or 1310, and/or (2) interconnect segments on interconnect layers of each die.

Through vertical signal paths, each IF unit 1312 retrieves instructions from the instruction memory and provides the retrieved instructions to its instruction decode unit 1314. This decode unit decodes each instruction that it receives and supplies the decoded instruction to its execution unit to execute. Through the vertical signal paths, each execution unit receives, from the data registers and memories 1324, operands that it needs to execute a received instruction, and provides the result of its execution to its write-back unit 1318. Through the vertical signal paths, each write-back unit 1318 stores the execution results in the data registers and memories 1324. Other embodiments use other architectures to split a processor core between two different dies. For instance, some embodiments place the instruction decode and execution units 1314 and 1316 on different layers than the instruction fetch and write back units 1312 and 1318. Still other embodiments use other arrangements to split a processor core between different dies. These or other embodiments put different ALUs, or different portions of the same ALU, of a processor core on different vertically stacked dies (e.g., on two dies that are face-to-face mounted through a DBI bonding process).

Figure 14:
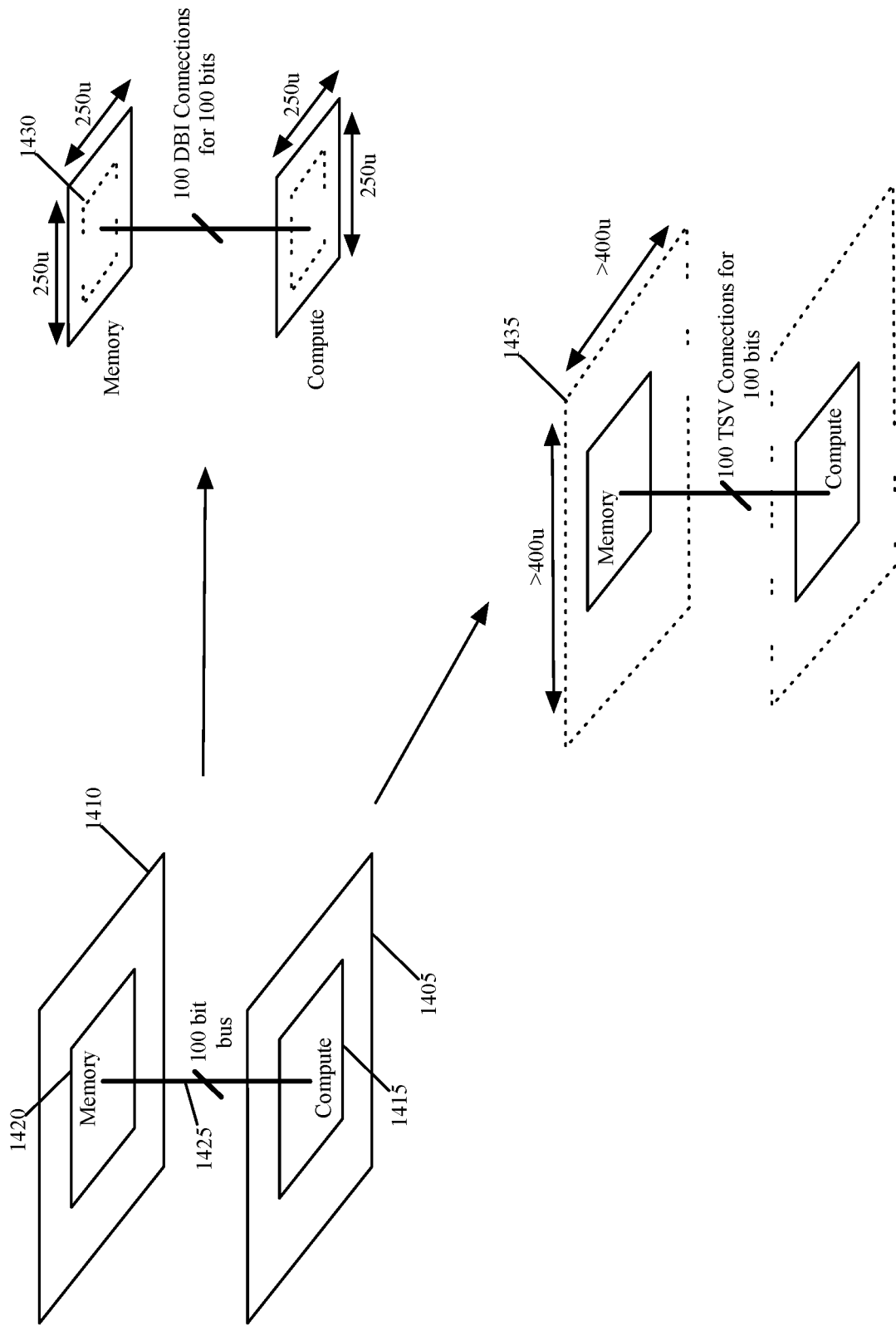
FIG. 14 shows a compute circuit on a first die that overlaps a memory circuit on a second die, which is vertically stacked over the first die.

As mentioned above, it is advantageous to use DBI connections to connect overlapping connected regions on two dies that are vertically stacked because DBI allows for far greater density of connections than other z-axis connection schemes. FIG. 14 presents an example that illustrates this. This figure shows a compute circuit 1415 on a first die 1405 that overlaps a memory circuit 1420 on a second die 1410, which is vertically stacked over the first die 1405. The compute circuit can be any type of compute circuit (e.g., processor cores, processor pipeline compute units, neural network neurons, logic gates, adders, multipliers, etc.) and the memory circuit can be any type of memory circuit (e.g., SRAMs, DRAMs, non-volatile memories, caches, etc.).

In this example, both circuits 1415 and 1420 occupy a square region of 250 by 250 microns on their respective dies 1405 and 1410 (only the substrate surfaces of which are shown in FIG. 14). Also, in this example, a 100-bit z-axis bus 1425 is defined between these circuits, with the term bus in this example referring to the data and control signals exchanged between these two circuits 1415 and 1420 (in other examples, a bus might only include data signals). FIG. 14 illustrates that when TSVs are used to define this z-axis bus 1425, this bus will consume on each die a region 1435 that is at least 2.5 times as large as the size of either circuit on that die. This is because TSVs have a 40 micron pitch. For the TSV connections, the two dies 1405 and 1410 will be front-to-back mounted with the TSVs going through the substrate of one of the two dies.

On the other hand, when the two dies are face-to-face bonded through mounted, and DBI connections are used to define the 100-bit z-axis bus 1425, the cross-section 1430 of the DBI bus can be contained within the footprint (i.e., the substrate region) of both circuits 1415 and 1420 on their respective dies. Specifically, assuming that the DBI connections have a 2 micron pitch, the 100 DBI connections can be fit in as little as 20-by-20 micron square, as the 100 connections can be defined as a 10-by-10 array with each connection having a minimum center-to-center spacing of 2 microns with its neighboring connections. By being contained within the footprint of the circuits 1415 and 1420, the DBI connections would typically not consume any precious routing space on the dies 1405 and 1410 beyond the portion already consumed by the circuits. In some embodiments, DBI connections can have a pitch ranging from less than 1 micron (e.g., 0.2 or 0.5 microns) to 5 microns.

As the numbers of bits increase in the bus 1425, the difference between the amount of space consumed by the TSV connections and the space consumed by DBI connections becomes even more pronounced. For instance, when 3600 bits are exchanged between the two circuits 1415 and 1420, a 60-by-60 TSV array would require a minimum 2400-by-2400 micron region (at a 40-micron DBI pitch), while a 60-by-60 DBI array would require a minimum 120-by-120 region (at a 2-micron DBI pitch). In other words, the TSVs would have a footprint that is at least 400 times greater than the footprint of the DBI connections. It is quite common to have a large number of bits exchanged between a memory circuit and a compute circuit when performing computations (e.g., dot product computations) in certain compute environments (e.g., machine-trained neural networks). Moreover, the density of DBI connections allows for very large bandwidth (e.g., in the high gigabytes or in the terabytes range) between overlapping compute and memory circuits.

Figure 15:
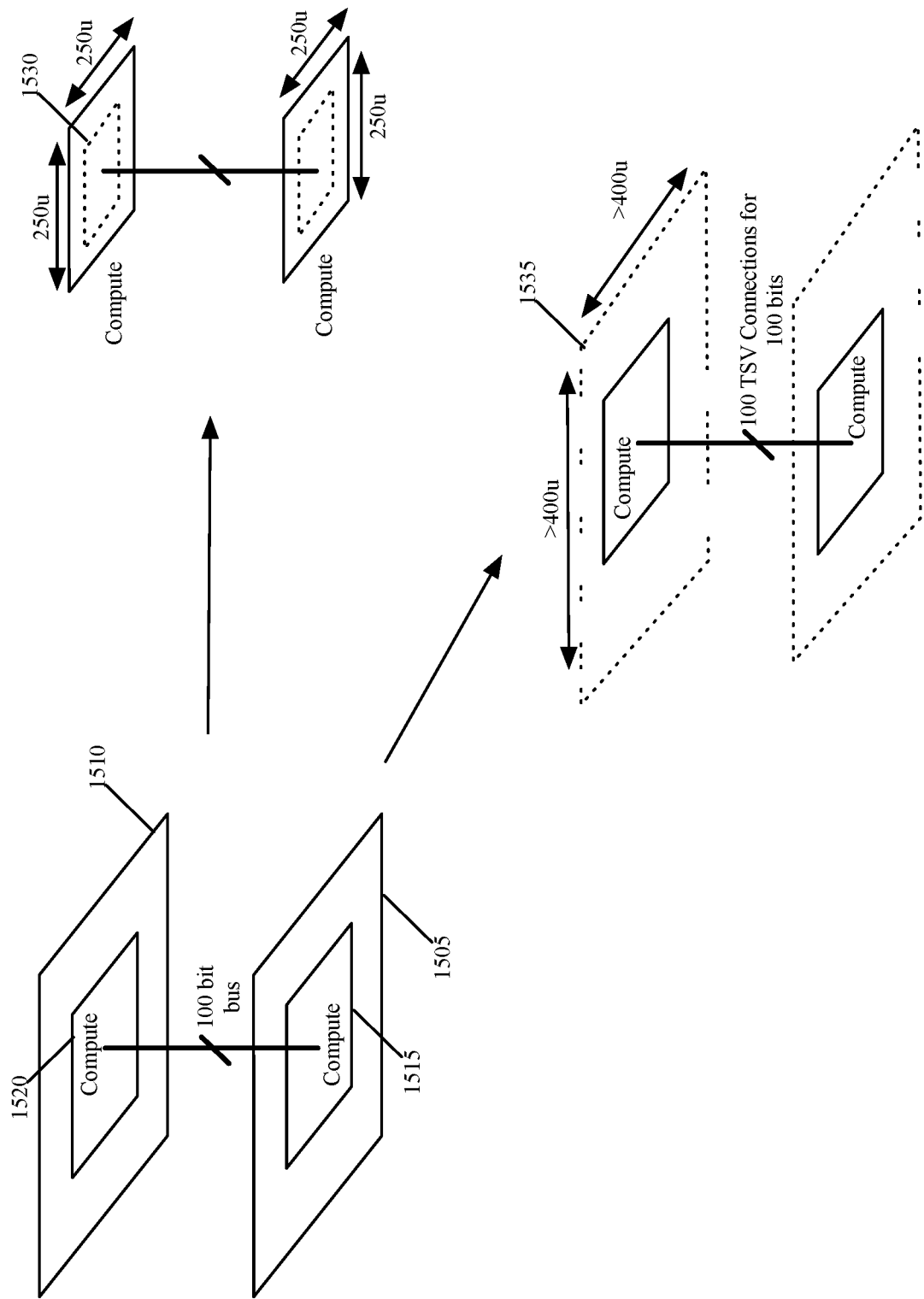
FIG. 15 shows two overlapping compute circuits on two vertically stacked dies.

The density of DBI connection is also advantageous in connecting overlapping circuit regions on two dies that are vertically stacked. FIG. 15 presents an example that illustrates this. This figure shows two overlapping compute circuits 1515 and 1520 on two vertically stacked dies 1505 and 1510. Each of the circuits occupies a 250-by-250 micron square on its corresponding die's substrate, and can be any type of compute circuit (e.g., processor cores, processor pipeline compute units, neural network neurons, logic gates, adders, multipliers, etc.).

Like the example in FIG. 14, the example in FIG. 15 shows that when DBI connections are used (i.e., when the two dies 1505 and 1510 are face-to-face mounted through DBI), and the DBI connections have a 2-micron pitch, a 100-bit bus 1525 between the two circuits 1515 and 1520 can be contained in a region 1530 that is 20-by-20 micron square that can be wholly contained within the footprints of the circuits. On the other hand, when TSV connections are used (e.g., when the two dies are face-to-back mounted and connected using TSVs), the 100-bit bus 1525 would consume at a minimum a 400-by-400 micron square region 1535, which is larger than the footprint of the compute circuits 1515 and 1520. This larger footprint would consume additional routing space and would not be as beneficial as the smaller footprint that could be achieved by the DBI connections.

Figure 16:
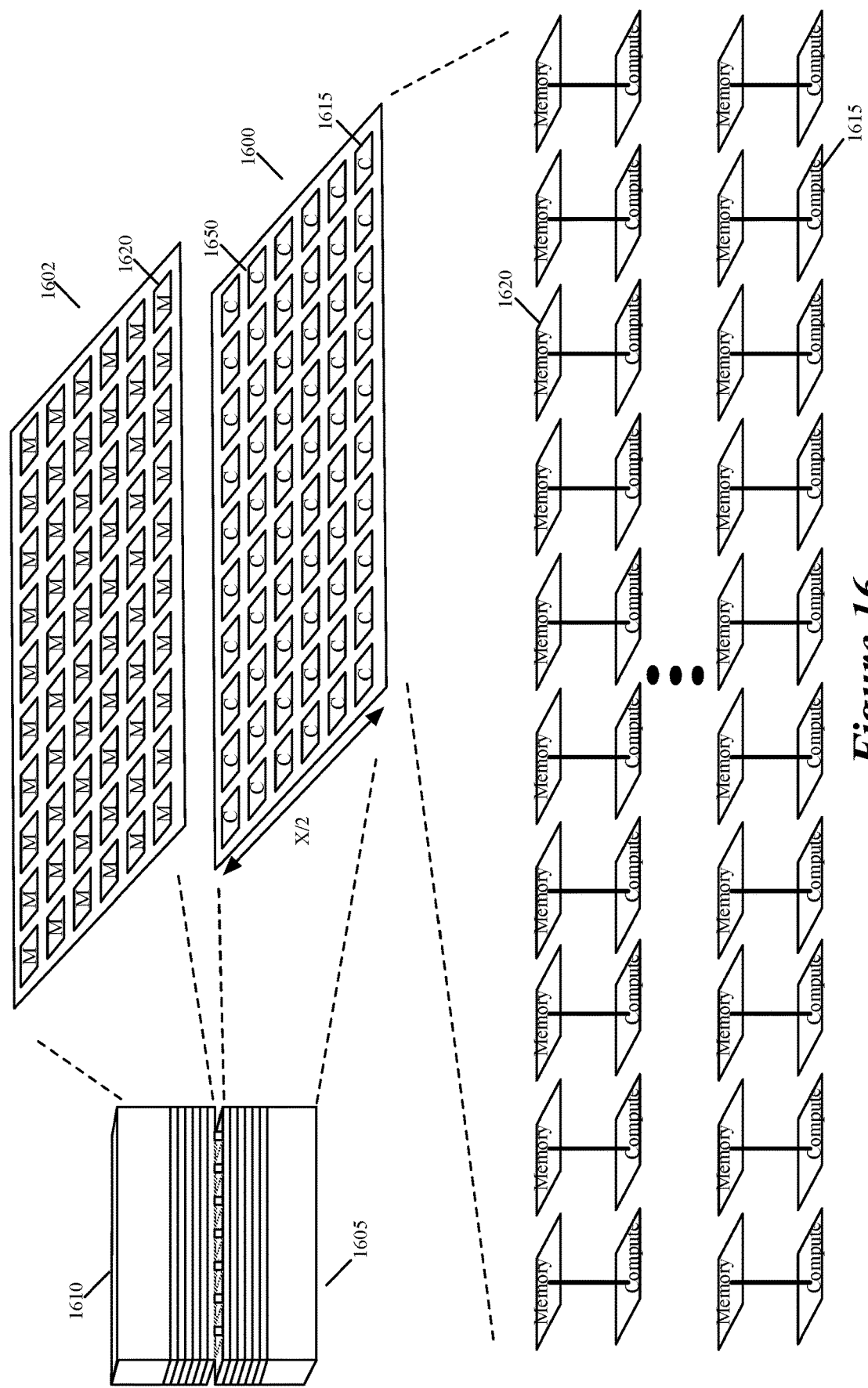
FIG. 16 illustrates an array of compute circuits on a first die overlapping an array of memories on a second die that is face-to-face mounted with the first die through direct bonded interconnect (DBI) boding process.

High density DBI connections can also be used to reduce the size of a circuit formed by numerous compute circuits and their associated memories. The DBI connections can also provide this smaller circuit with very high bandwidth between the compute circuits and their associated memories. FIG. 16 presents an example that illustrates these benefits. Specifically, it illustrates the reduction in the size of an array 1600 of compute circuits 1615 on a first die, by moving the memories 1620 for these circuits to a second die 1610 that is face-to-face mounted with the first die 1605 through DBI boding process. In this example, a 6-by-10 array of compute circuits is illustrated, but in other examples, the array can have larger number of circuits (e.g., more than 100 circuits, more than 1000 circuits). Also, in other embodiments, the compute circuits and their associated memory circuits can be organized in an arrangement other than an array.

The compute circuits 1615 and the memory circuits 1620 can be any type of computational processing circuits and memory circuits. For instance, in some embodiments, the circuit array 1600 is part of an FPGA that has an array of logic circuits (e.g., logic gates and/or look-up tables, LUTs) and an array of memory circuits, with each memory in the memory array corresponding to one logic circuit in the circuit array. In other embodiments, the compute circuits 1615 are neurons of a neural network or multiplier-accumulator (MAC) circuits of neurons. The memory circuits 1620 in these embodiments store the weights and/or the input/output data for the neurons or the MAC circuits. In still other embodiments, the compute circuits 1615 are processing circuits of a GPU, and the memory circuits store the input/output data from these processing circuits.

Figure 17:
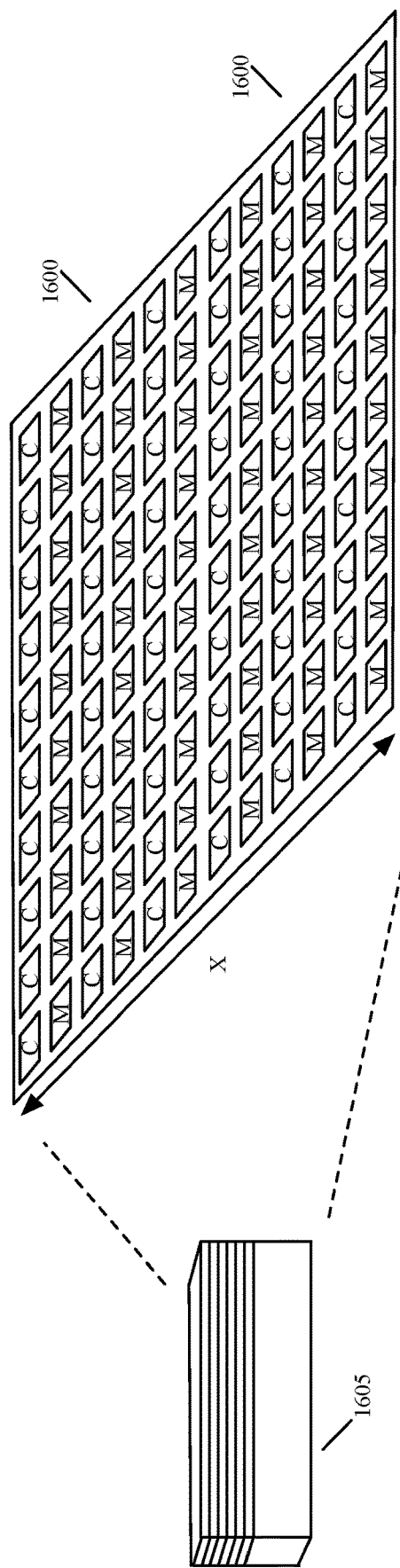
FIG. 17 illustrates a traditional way of interlacing a memory array with a compute array.

As shown in FIG. 17, a memory array is typically interlaced with the circuit array in most single die implementations today. The combined length of the two interlaced arrays is X microns in the example in FIG. 17. To connect two circuits in the same column in the array, the wiring would have to be at least X microns. But by moving the memory circuits onto the second die 1610, as shown in FIG. 16, two circuits in the same column can be connected with a minimum wiring length of X/2 microns.

Moreover, each memory circuit can have a higher density of storage cells as less space is consumed for defining shared peripheral channels for outputting signals to the circuits, as these output signals can now traverse in the z-axis. Also, by moving the memory circuits onto the second IC die 1610, more routing space is available in the open channels 1650 (on the substrate and metal layers) between the compute circuits in the compute array 1600 on the first die 1605, and between the memory circuits in the memory array 1602 on the second die 1610. This additional routing space makes it easier to connect the outputs of the compute circuits. In many instances, this extra routing space allows these interconnects to have shorter wire lengths. It also makes it easier for compute circuits in some embodiments to read or write data from the memory circuits of other compute circuits. The DBI connections are also used in some embodiments to route signals through the metal layers of the second die 1610 in order to define the signal paths (i.e., the routes) for connecting the compute circuits 1615 that are defined on the first die 1605.

The higher density of DBI connections also allow a higher number of z-axis connections to be defined between corresponding memory and compute circuits that are wholly contained within the footprints (i.e., within the substrate regions occupied by) of a pair of corresponding memory and compute circuits. As mentioned before, these DBI connections connect the top interconnect layer of one die with the top interconnect layer of the other die, while the rest of the connection between a pair of memory and compute circuits is established with interconnects and vias on these dies. Again, such an approach would be highly beneficial when the compute circuits need wide buses (e.g., 128 bit buses, 256 bit buses, 512 bit buses, 1000 bit buses, 4000 bit buses, etc.) to their corresponding memory circuits. One such example would be when the array of compute circuits are arrays of neurons that need to access a large amount of data from their corresponding memory circuits.

Figure 18:
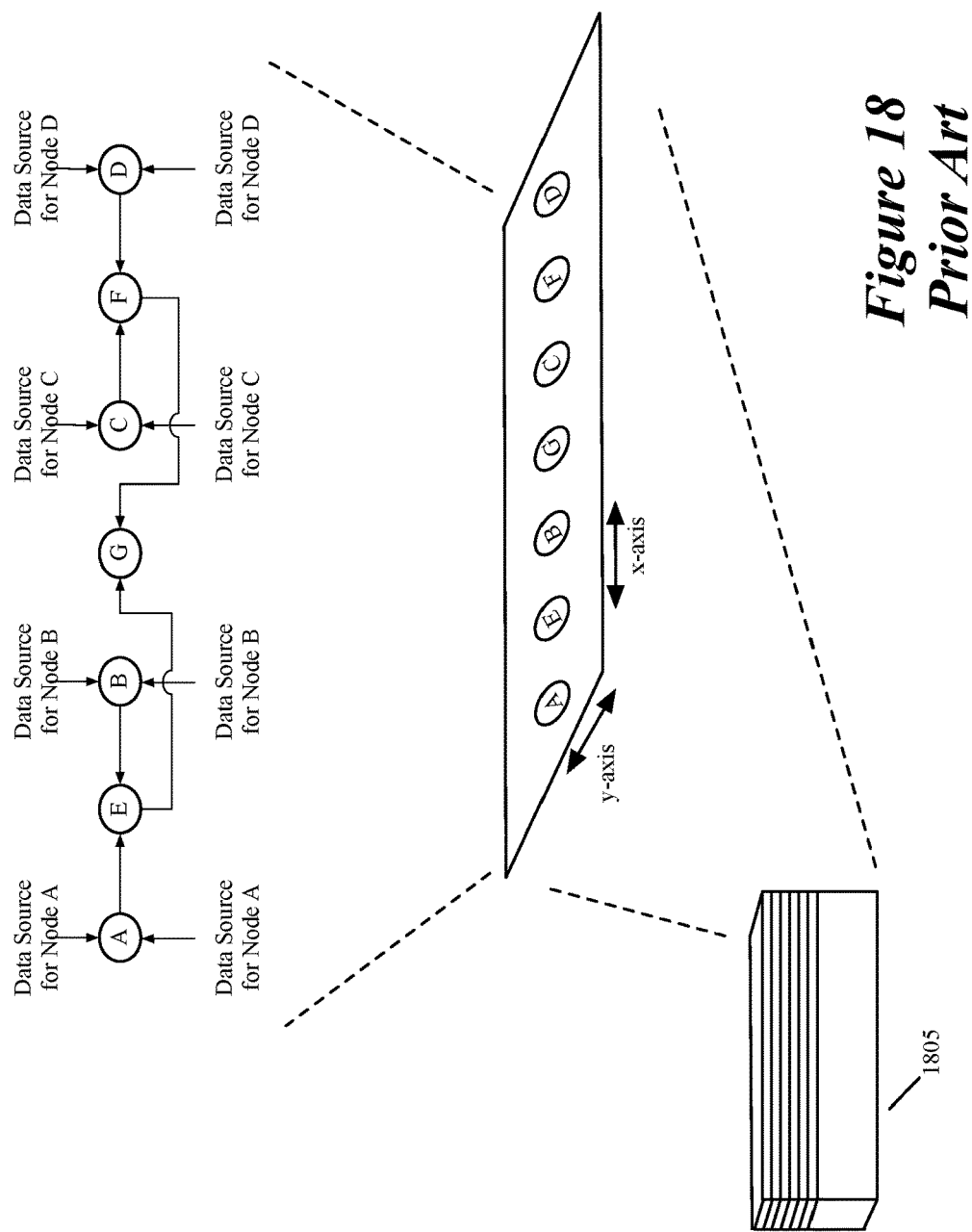
FIGS. 18 and 19 illustrates two examples that show how high density DBI connections can be used to reduce the size of an arrangement of compute circuit that is formed by several successive stages of circuits, each of which performs a computation that produces a result that is passed to another stage of circuits until a final stage of circuits is reached.
Figure 18:
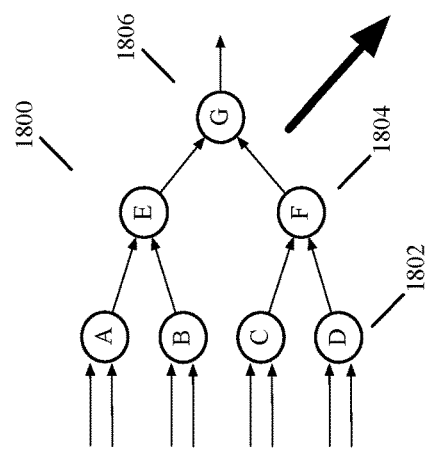
Figure 19:
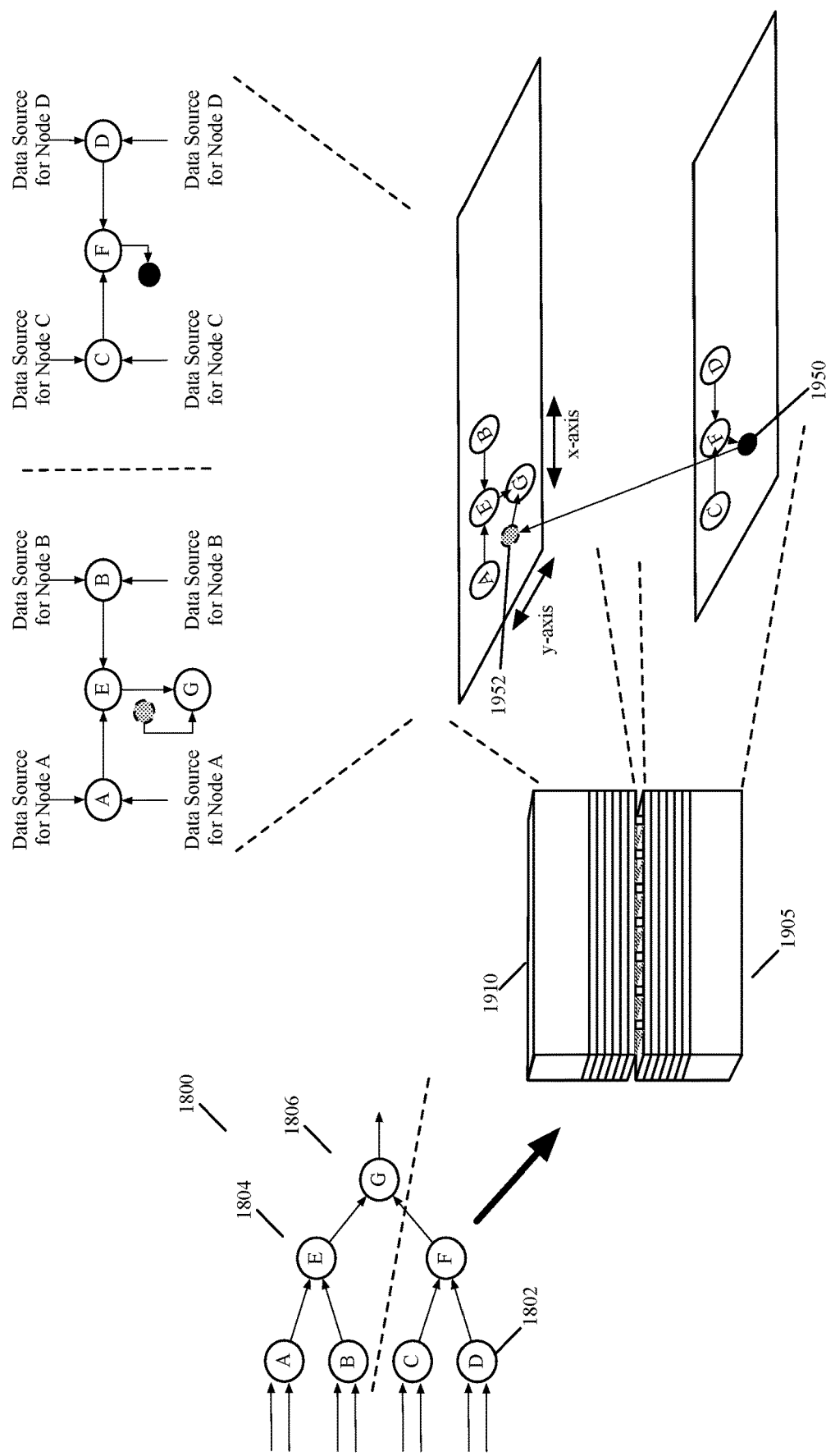

FIGS. 18 and 19 illustrates two examples that show how high density DBI connections can be used to reduce the size of an arrangement of compute circuit that is formed by several successive stages of circuits, each of which performs a computation that produces a result that is passed to another stage of circuits until a final stage of circuits is reached. In some embodiments, such an arrangement of compute circuits can be an adder tree, with each compute circuit in the tree being an adder. In other embodiments, the circuits in the arrangement are multiply accumulate (MAC) circuits, such as those used in neural networks to compute dot products.

The examples in FIGS. 18 and 19 both illustrate one implementation of a circuit 1800 that performs a computation (e.g., an addition or multiplication) based on eight input values. In some embodiments, each input value is a multi-bit value (e.g., a thirty-two bit value). The circuit 1800 has three stages with the first stage 1802 having four compute circuits A-D, the second stage 1804 having two compute circuits E and F, and the third stage 1806 having a compute circuit G. Each compute circuit in the first stage 1802 performs an operation based on two input values. In the second stage 1804, the compute circuit E performs a computation based on the outputs of compute circuits A and B, while the compute circuit F performs a computation based on the outputs of compute circuits C and D. Lastly, the compute circuit G in the third stage 1806 performs a computation based on the outputs of compute circuits E and F.

FIG. 18 illustrates a prior art implementation of the circuit 1800 on one IC die 1805. In this implementation, the compute circuits A-G are arranged in one row in the following order: A, E, B, G, C, F and D. As shown, the first stage compute circuits A-D (1) receive their inputs from circuits (e.g., memory circuits or other circuits) that are above and below in the planar y-axis direction, and (2) provide their results to the compute circuit E or F. The compute circuits E and F provide the result of their computations to compute circuit G in the middle of the row. The signal path from the compute circuits E and F is relatively long and consumes nearby routing resources. The length and congestion of interconnects become worse as the size of the circuit arrangement (e.g., the adder or multiplication tree) grows. For instance, to implement an adder tree that adds 100 or 1000 input values, numerous adders are needed in numerous stages, which quickly results in long, big data buses to transport computation results between successive stages of adders.

FIG. 19 illustrates a novel implementation of the circuit 1800 that drastically reduces the size of the connections needed to supply the output of compute circuits E and F to the compute circuit G. As shown, this implementation defines the compute circuits A, B, E and G on a first die 1910, while defining the compute circuits C, D and F on a second die 1905 that is face-to-face mounted on the first die 1905 through a DBI boding process. The compute circuits A, B, E, and G are defined in a region on the first die 1910 that overlaps with a region on the second die 1905 in which the compute circuits C, D and F are defined.

In this implementation, the compute circuit G is placed below the compute circuit E in the planar y-direction. At this location, the compute circuit G receives the output of the compute circuit E through a short data bus defined on the die 1910, while receiving the output of the compute circuit F through (1) z-axis DBI connections that connect overlapping locations 1950 and 1952 on the top interconnect layers of the dies 1905 and 1910, and (2) interconnects and vias on these dies that take the output of circuit F to the input of circuit G. In this implementation, the interconnects that provide the inputs to the compute circuit G are very short. The computation circuits E and G are next to each other and hence the signal path just includes a short length of the interconnect and vias between the circuit E and G. Also, the length of interconnects, vias, and z-axis DBI connections needed to provide the output of the compute circuit F to the compute circuit G is very small.

Hence, by breaking up the arrangement of the circuit 1800 between two dies 1905 and 1910, successive compute circuits can be placed closer to each other (because an additional dimension, i.e., the z-axis, is now available for placing circuits near each other), which, in turn, allows shorter interconnects to be defined between compute circuits in successive stages. Also, the high density of DBI connections makes it easier to define larger number of z-axis connections (that are needed for larger z-axis data buses) within the cross section of the regions that are used to define successive compute circuits.

Compute circuit arrangements can have more than three stages. For example, large adder or MAC trees can have many more stages (e.g., 8 stages, 10 stages, 12 stages, etc.). To implement such circuit arrangements, some embodiments (1) divide up the compute circuits into two or more groups that are then defined on two or more vertically stacked dies, and (2) arrange the different groups of circuits on these dies to minimize the length of interconnects needed to connect compute circuits in successive stages.

Figure 20:
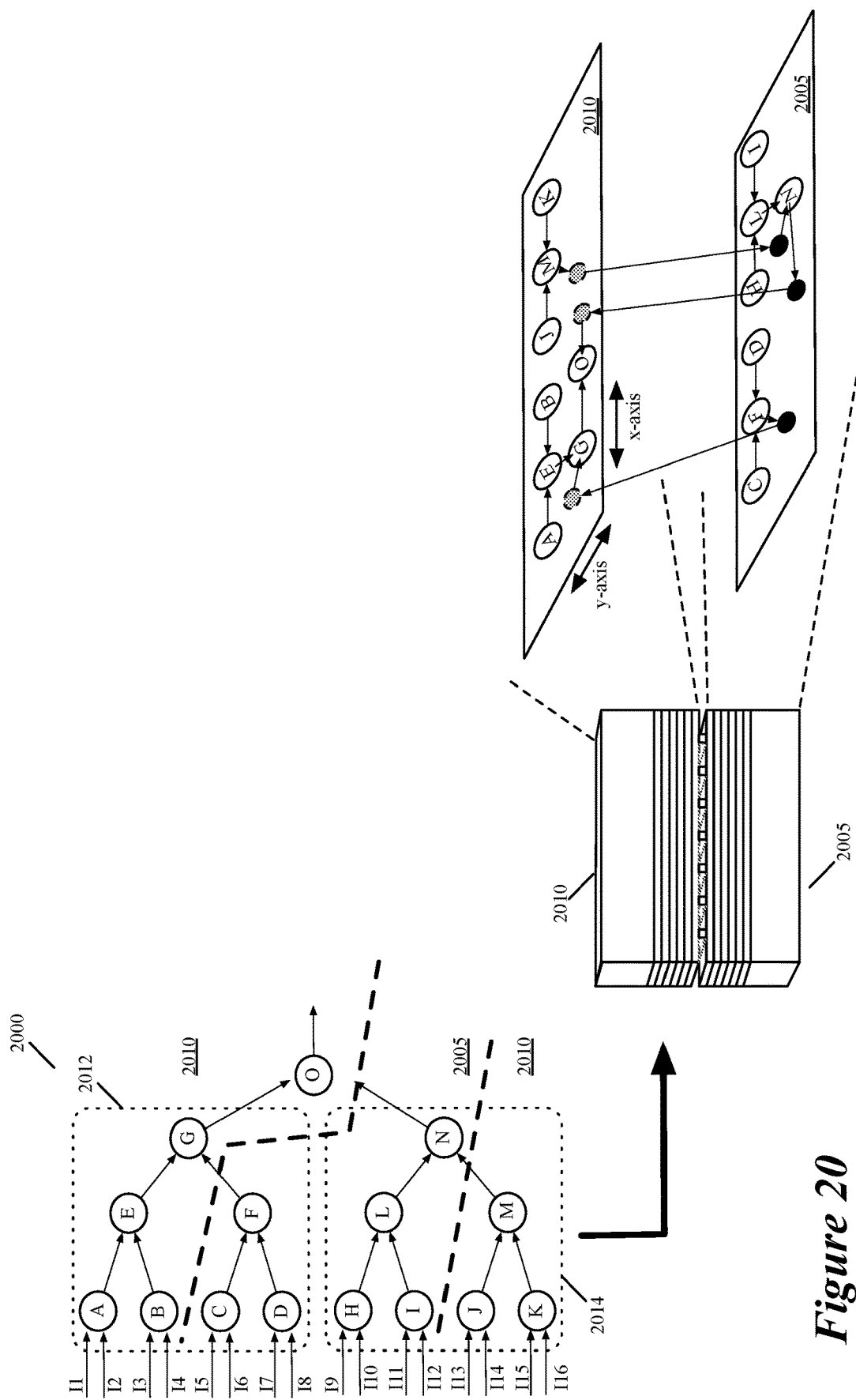
FIG. 20 presents a compute circuit that performs a computation (e.g., an addition or multiplication) on sixteen multi-bit input values on two face-to-face mounted dies.

FIG. 20 presents an example to illustrate this point. This example shows one implementation of a compute circuit 2000 that performs a computation (e.g., an addition or multiplication) on sixteen multi-bit input values. This circuit includes two versions 2012 and 2014 of the compute circuit 1800 of FIGS. 18 and 19. The compute circuits in the second version are labeled as circuits H-N. Each of these versions has three stages. The outputs of these two versions are provided to a fourth stage compute circuit O that performs a computation based on these outputs, as shown.

To implement the four stage circuit 2000, the two versions 2012 and 2014 have an inverted layout. This is because the compute circuits A, B, and E (that operate on the first four inputs of the first version 2012) are defined on IC die 2010 while the compute circuits H, I and L (that operate on the first four inputs of the second version) are defined on the IC die 2005. Similarly, the compute circuits C, D, and F (that operate on the second four inputs of the first version 2012) are defined on IC die 2005 while the compute circuits J, K, and M (that operate on the second four inputs of the second version) are defined on the IC die 2010. Also, the third stage circuit G of the first version is defined on the IC die 2010, while the third stage circuit N is defined on the IC die 2005. The fourth stage aggregating circuit O is also defined on IC die 2010. Lastly, the second version 2014 is placed to the right of the first version in the x-axis direction.

This overall inverted arrangement of the second version 2014 with respect to the first version ensures that the length of the interconnect needed to provide the output of the third stage compute circuits G and N to the fourth stage compute circuit O is short. This is because, like compute circuits E, F and G, the compute circuits L, M, and N are placed in nearby and/or overlapping locations, which allows these three circuits L, M and N to be connected through short DBI connections, and mostly vertical signal paths facilitated by small planar interconnects plus several via connections. This arrangement also places compute circuits G, N and O in nearby and/or overlapping locations, which again allows them to be connected through short DBI connections, and mostly vertical signal paths facilitated by small planar interconnects plus several via connections.

Figure 21:
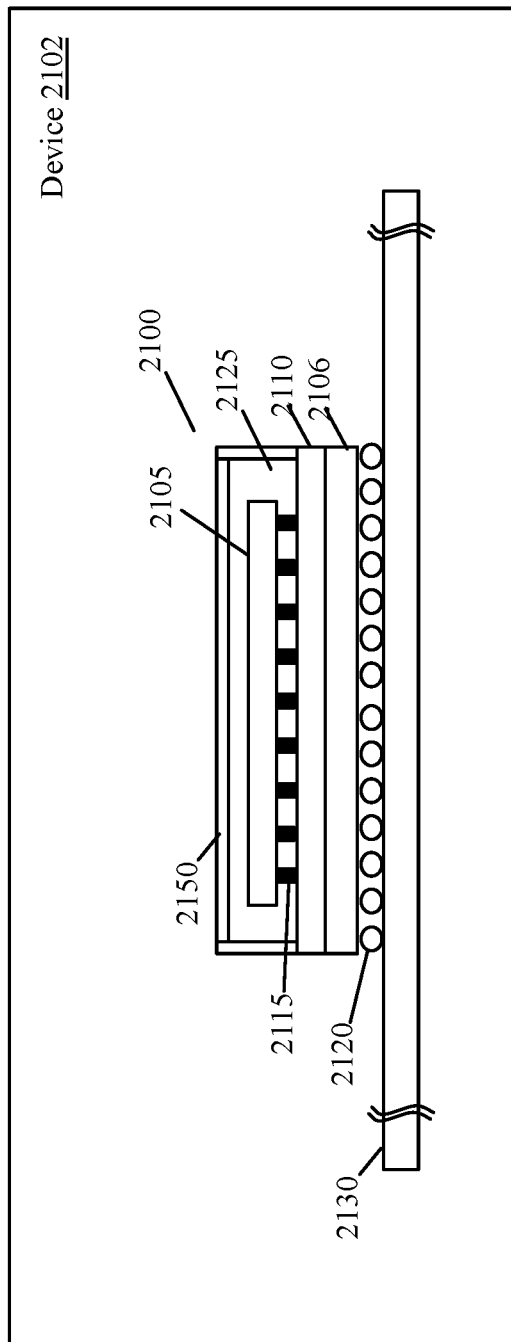
FIG. 21 illustrates a device that uses a 3D IC.

FIG. 21 illustrates a device 2102 that uses a 3D IC 2100 (like any of the 3D IC 210, 200, 400, 600-900). In this example, the 3D IC 2100 is formed by two face-to-face mounted IC dies 2105 and 2110 that have numerous direct bonded connections 2115 between them. In other examples, the 3D IC 2100 includes three or more vertically stacked IC dies. As shown, the 3D IC die 2100 includes a cap 2150 that encapsulates the dies of this IC in a secure housing 2125. On the back side of the die 2110 one or more TSVs and/or interconnect layers 2106 are defined to connect the 3D IC to a ball grid array 2120 (e.g., a micro bump array) that allows this to be mounted on a printed circuit board 2130 of the device 2102. The device 2102 includes other components (not shown). In some embodiments, examples of such components include one or more memory storages (e.g., semiconductor or disk storages), input/output interface circuit(s), one or more processors, etc.

In some embodiments, the first and second dies 2105 and 2110 are the first and second dies shown in any of the FIGS. 1-2, 4, 6-16, and 19-20. In some of these embodiments, the second die 2110 receives data signals through the ball grid array, and routes the received signals to I/O circuits on the first and second dies through interconnect lines on the interconnect layer and vias between the interconnect layers. When such data signals need to traverse to the first die, these signals traverse through z-axis connections crossing the face-to-face bonding layer.

Figure 22:
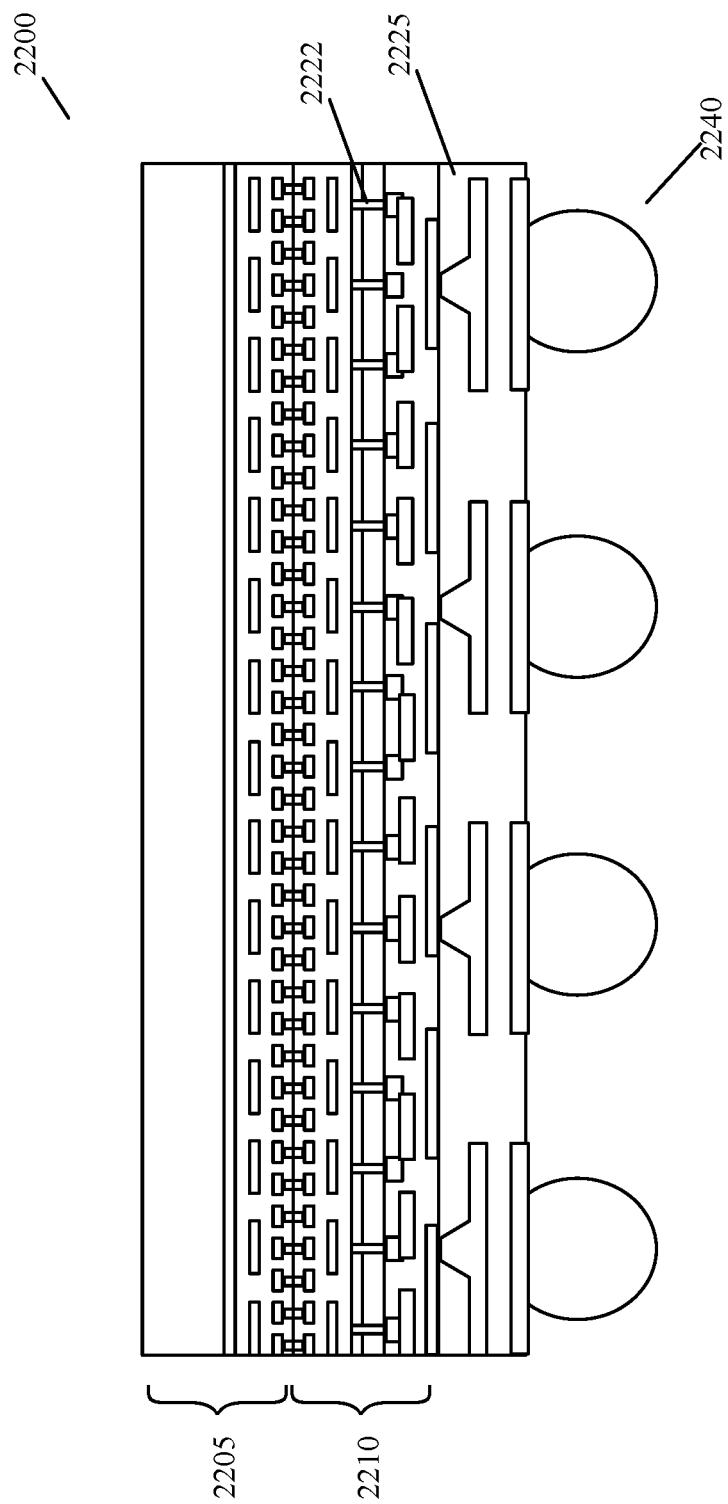
FIG. 22 provides an example of a 3D chip that is formed by two face-to-face mounted IC dies that are mounted on a ball grid array.

FIG. 22 provides another example of a 3D chip 2200 that is formed by two face-to-face mounted IC dies 2205 and 2210 that are mounted on a ball grid array 2240. In this example, the first and second dies 2205 and 2210 are face-to-face connected through direct bonded connections (e.g., DBI connections). As shown, several TSVs 2222 are defined through the second die 2210. These TSVs electrically connect to interconnects/pads on the backside of the second die 2210, on which multiple levels of interconnects are defined.

In some embodiments, the interconnects on the backside of the second die 2210 create the signal paths for defining one or more system level circuits for the 3D chip 2200 (i.e., for the circuits of the first and second dies 2205 and 2210). Examples of system level circuits are power circuits, clock circuits, data I/O signals, test circuits, etc. In some embodiments, the circuit components that are part of the system level circuits (e.g., the power circuits, etc.) are defined on the front side of the second die 2210. The circuit components can include active components (e.g., transistors, diodes, etc.), or passive/analog components (e.g., resistors, capacitors (e.g., decoupling capacitors), inductors, filters, etc.

In some embodiments, some or all of the wiring for interconnecting these circuit components to form the system level circuits are defined on interconnect layers on the backside of the second die 2210. Using these backside interconnect layers to implement the system level circuits of the 3D chip 2200 frees up one or more interconnect layers on the front side of the second die 2210 to share other types of interconnect lines with the first die 2205. The backside interconnect layers are also used to define some of the circuit components (e.g., decoupling capacitors, etc.) in some embodiments. As further described below, the backside of the second die 2210 in some embodiments can also connect to the front or back side of a third die.

In some embodiments, one or more of the layers on the backside of the second die 2210 are also used to mount this die to the ball grid array 2240, which allows the 3D chip 2100 to mount on a printed circuit board. In some embodiments, the system circuitry receives some or all of the system level signals (e.g., power signals, clock signals, data I/O signals, test signals, etc.) through the ball grid array 2240 connected to the backside of the third die.

Figure 23:
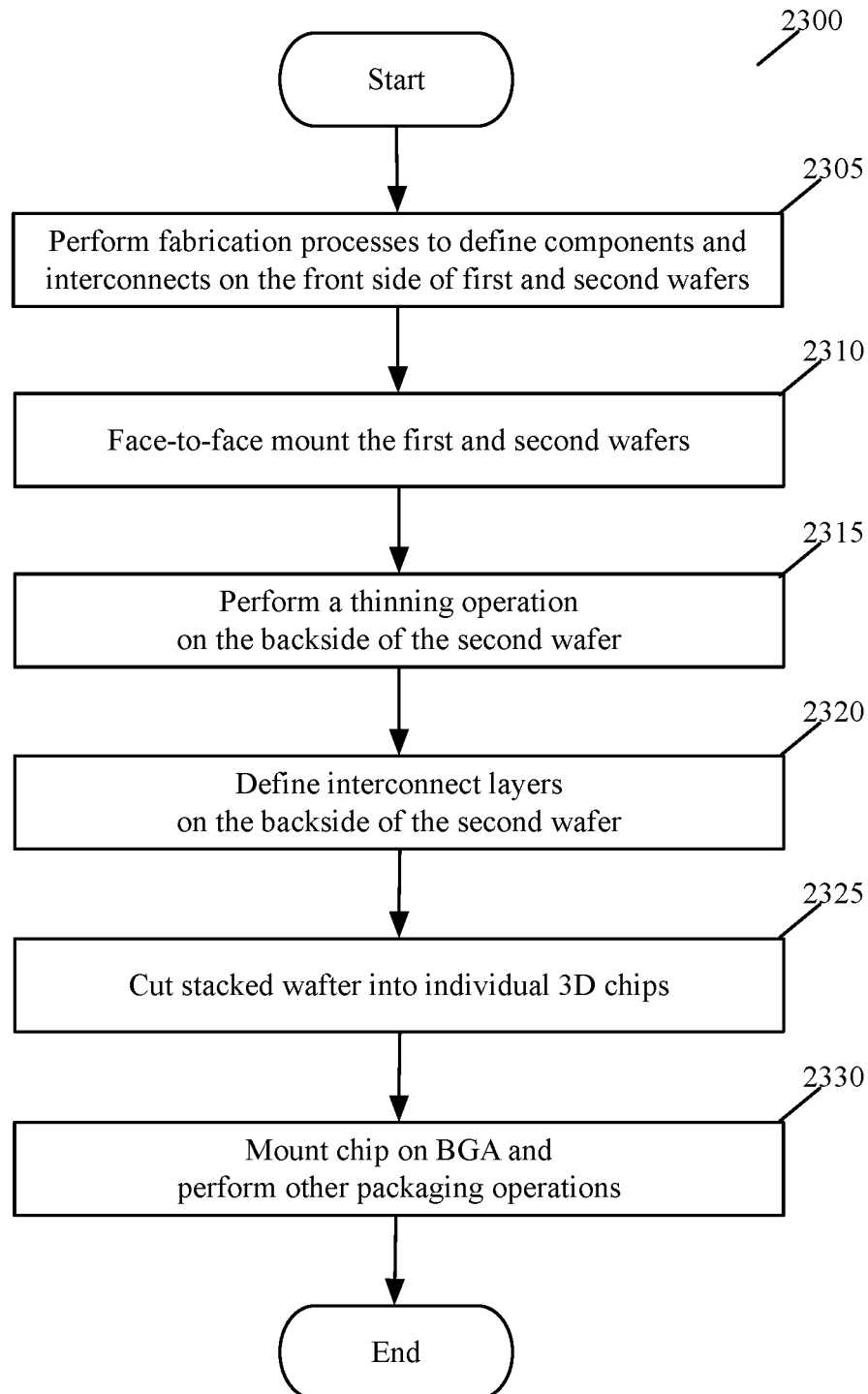
FIG. 23 illustrates a manufacturing process that some embodiments use to produce the 3D chip.

FIG. 23 illustrates a manufacturing process 2300 that some embodiments use to produce the 3D chip 2200 of FIG. 22. This figure will be explained by reference to FIGS. 24-27, which show two wafers 2405 and 2410 at different stages of the process. Once cut, the two wafers produce two stacked dies, such as dies 2205 and 2210. Even though the process 2300 of FIG. 23 cuts the wafers into dies after the wafers have been mounted and processed, the manufacturing process of other embodiments performs the cutting operation at a different stage at least for one of the wafers. Specifically, some embodiments cut the first wafer 2405 into several first dies that are each mounted on the second wafer before the second wafer is cut into individual second dies.

As shown, the process 2300 starts (at 2305) by defining components (e.g., transistors) on the substrates of the first and second wafers 2405 and 2410, and defining multiple interconnect layers above each substrate to define interconnections that form micro-circuits (e.g., gates) on each die. To define these components and interconnects on each wafer, the process 2300 performs multiple IC fabrication operations (e.g., film deposition, patterning, doping, etc.) for each wafer in some embodiments. FIG. 24 illustrates the first and second wafers 2405 and 2410 after several fabrication operations that have defined components and interconnects on these wafers. As shown, the fabrication operations for the second wafer 2410 defines several TSVs 2412 that traverse the interconnect layers of the second wafer 2410 and penetrate a portion of this wafer's substrate 2416.

After the first and second wafers have been processed to define their components and interconnects, the process 2300 face-to-face mounts (at 2310) the first and second wafers 2205 and 2210 through a direct bonding process, such as a DBI process. FIG. 25 illustrates the first and second wafers 2405 and 2410 after they have been face-to-face mounted through a DBI process. As shown, this DBI process creates a number of direct bonded connections 2426 between the first and second wafers 2405 and 2410.

Next, at 2315, the process 2300 performs a thinning operation on the backside of the second wafer 2410 to remove a portion of this wafer's substrate layer. As shown in FIG. 26, this thinning operation exposes the TSVs 2412 on the backside of the second wafer 2410. After the thinning operation, the process 2300 defines (at 2320) one or more interconnect layers 2430 the second wafer's backside. FIG. 27 illustrates the first and second wafers 2405 and 2410 after interconnect layers have been defined on the second wafer's backside.

These interconnect layers 2430 include one or more layers that allow the 3D chip stack to electrically connect to the ball grid array. In some embodiments, the interconnect lines/pads on the backside of the third wafer also produce one or more redistribution layers (RDL layers) that allow signals to be redistributed to different locations on the backside. The interconnect layers 2430 on the backside of the second die in some embodiments also create the signal paths for defining one or more system level circuits (e.g., power circuits, clock circuits, data I/O signals, test circuits, etc.) for the circuits of the first and second dies. In some embodiments, the system level circuits are defined by circuit components (e.g., transistors, etc.) that are defined on the front side of the second die. The process 2300 in some embodiments does not define interconnect layers on the backside of the second wafer to create the signal paths for the system level circuits, as it uses only the first and second dies' interconnect layers between their two faces for establishing the system level signal paths.

After defining the interconnect layers on the backside of the second wafer 2410, the process cuts (at 2325) the stacked wafers into individual chip stacks, with each chip stack include two stacked IC dies 2205 and 2210. The process then mounts (at 2330) each chip stack on a ball grid array and encapsulates the chip stack within one chip housing (e.g., by using a chip case). The process then ends.

Figure 28:
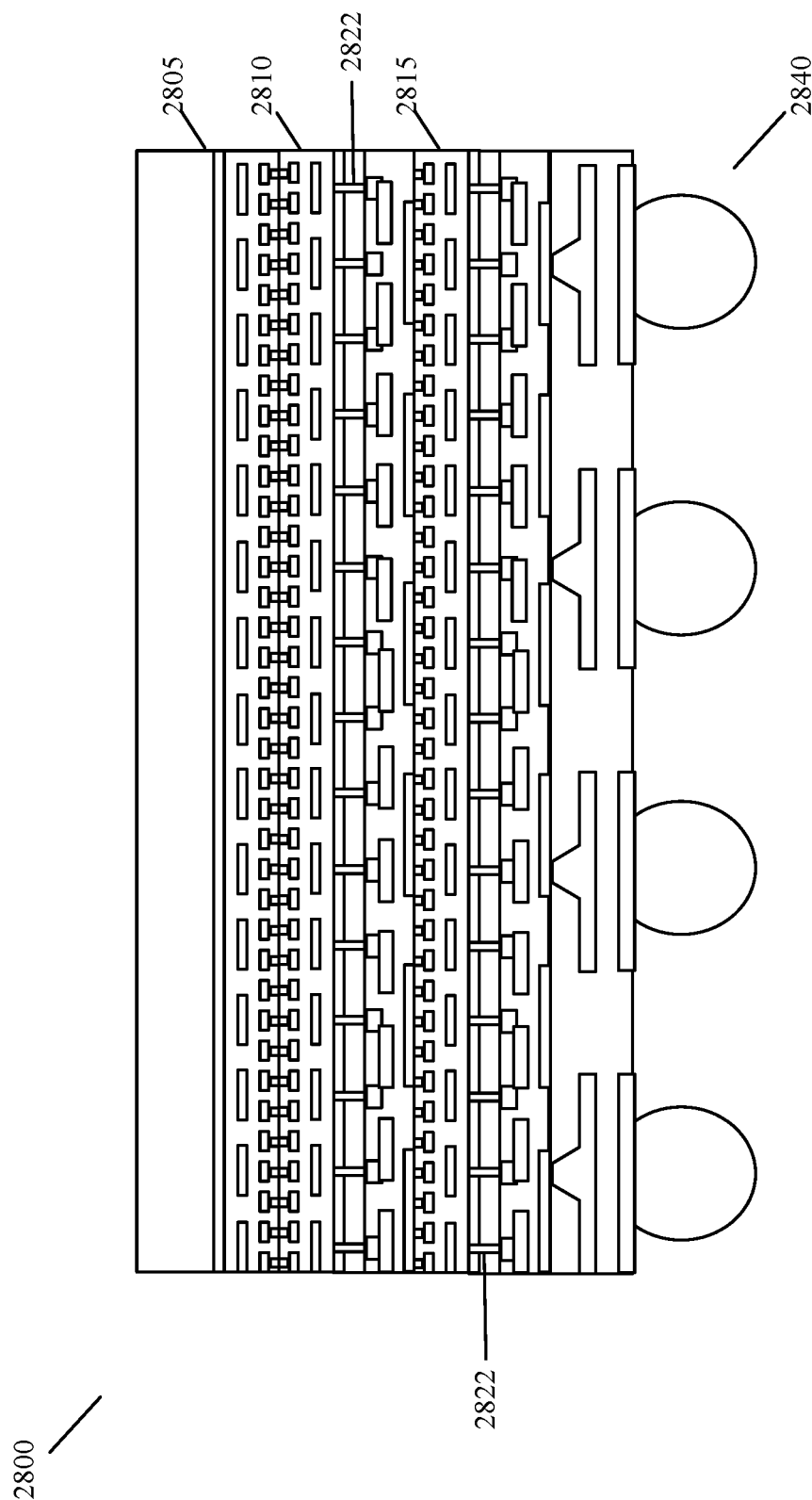
FIG. 28 illustrates an example of a 3D chip with three stacked IC dies.

In some embodiments, three or more IC dies are stacked to form a 3D chip. FIG. 28 illustrates an example of a 3D chip 2800 with three stacked IC dies 2805, 2810 and 2815. In this example, the first and second dies 2805 and 2810 are face-to-face connected through direct bonded connections (e.g., DBI connections), while the third and second dies 2815 and 2810 are face-to-back connected (e.g., the face of the third die 2815 is mounted on the back of the second die 2810). In some embodiments, the first and second dies 2805 and 2810 are the first and second dies shown in any of the FIGS. 1-2, 4, 6-16, and 19-20.

In FIG. 28, several TSVs 2822 are defined through the second die 2810. These TSVs electrically connect to interconnects/pads on the backside of the second die 2810, which connect to interconnects/pads on the top interconnect layer of the third die 2815. The third die 2815 also has a number of TSVs that connect signals on the front side of this die to interconnects/pads on this die's backside. Through interconnects/pads, the third die's backside connects to a ball grid array 2840 that allows the 3D chip 2800 to mount on a printed circuit board.

In some embodiments, the third die 2815 includes system circuitry, such as power circuits, clock circuits, data I/O circuits, test circuits, etc. The system circuitry of the third die 2815 in some embodiments supplies system level signals (e.g., power signals, clock signals, data I/O signals, test signals, etc.) to the circuits of the first and second dies 2805 and 2810. In some embodiments, the system circuitry receives some or all of the system level signals through the ball grid array 2840 connected to the backside of the third die.

Figure 29:
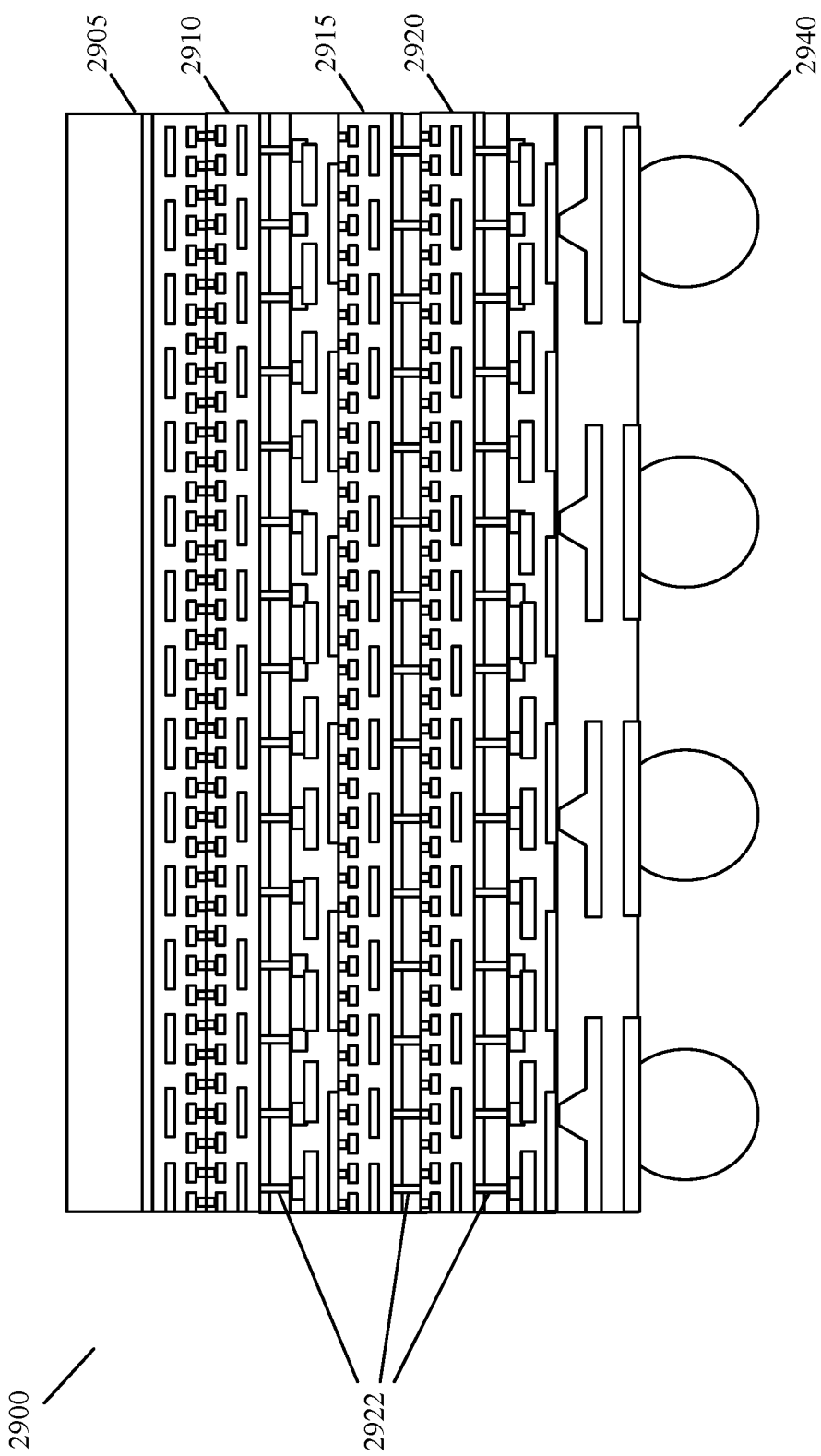
FIG. 29 illustrates an example of a 3D chip with four stacked IC dies.

FIG. 29 illustrates another example of a 3D chip 2900 with more than two stacked IC dies. In this example, the 3D chip 2900 has four IC dies 2905, 2910, 2915 and 2920. In this example, the first and second dies 2905 and 2910 are face-to-face connected through direct bonded connections (e.g., DBI connections), while the third and second dies 2915 and 2910 are face-to-back connected (e.g., the face of the third die 2915 is mounted on the back of the second die 2910) and the fourth and third dies 2920 and 2915 are face-to-back connected (e.g., the face of the fourth die 2920 is mounted on the back of the third die 2915). In some embodiments, the first and second dies 2905 and 2910 are the first and second dies shown in any of the FIGS. 1-2, 4, 6-16, and 19-20.

In FIG. 29, several TSVs 2922 are defined through the second, third and fourth die 2910, 2915 and 2920. These TSVs electrically connect to interconnects/pads on the backside of these dies, which connect to interconnects/pads on the top interconnect layer of the die below or the interconnect layer below. Through interconnects/pads and TSVs, the signals from outside of the chip are received from the ball grid array 2940.

Other embodiments use other 3D chip stacking architectures. For instance, instead of face-to-back mounting the fourth and third dies 2920 and 2915 in FIG. 29, the 3D chip stack of another embodiment has these two dies face-to-face mounted, and the second and third dies 2910 and 2915 back-to-back mounted. This arrangement would have the third and fourth dies 2915 and 2920 share a more tightly arranged set of interconnect layers on their front sides.

While the invention has been described with reference to numerous specific details, one of ordinary skill in the art will recognize that the invention can be embodied in other specific forms without departing from the spirit of the invention. For instance, in the examples illustrated in FIGS. 1-2, 4, 6-16, and 19-20, a first IC die is shown to be face-to-face mounted with a second IC die. In other embodiments, the first IC die is face-to-face mounted with a passive interposer that electrically connects the die to circuits outside of the 3D chip or to other dies that are face-to-face mounted or back-to-face mounted on the interposer. Some embodiments place a passive interposer between two faces of two dies. Some embodiments use an interposer to allow a smaller die to connect to a bigger die.

Figure 30:
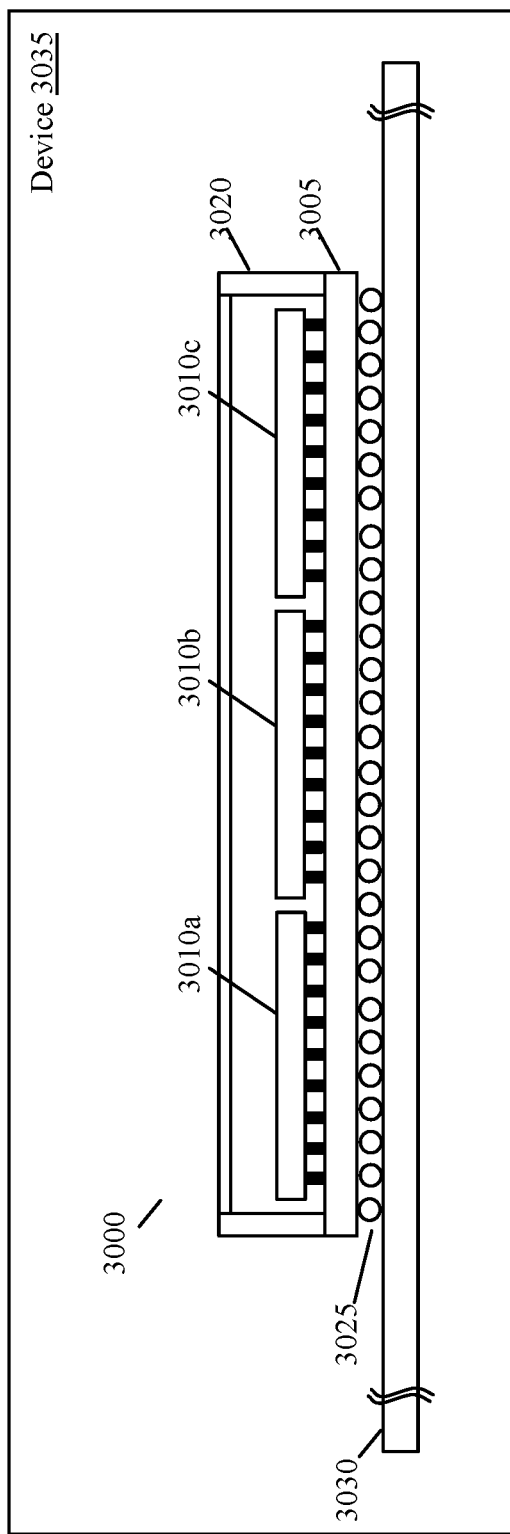
FIG. 30 illustrates a 3D chip that is formed by face-to-face mounting three smaller dies on a larger die.

Also, the 3D circuits and ICs of some embodiments have been described by reference to several 3D structures with vertically aligned IC dies. However, other embodiments are implemented with a myriad of other 3D structures. For example, in some embodiments, the 3D circuits are formed with multiple smaller dies placed on a larger die or wafer. FIG. 30 illustrates one such example. Specifically, it illustrates a 3D chip 3000 that is formed by face-to-face mounting three smaller dies 3010*a-c* on a larger die 3005. All four dies are housed in one chip 3000 by having one side of this chip encapsulated by a cap 3020, and the other side mounted on a micro-bump array 3025, which connects to a board 3030 of a device 1935. Some embodiments are implemented in a 3D structure that is formed by vertically stacking two sets of vertically stacked multi-die structures.

The invention claimed is:

1. A three dimensional (3D) processor circuit comprising:
 a first integrated circuit (IC) die comprising a first set of processor circuits;
 a second IC die stacked with the first IC die through a bonding layer that bonds the first and second IC dies, the second IC die comprising a second set of processor circuits that at least partially overlaps the first set of processor circuits;
 a plurality of connections crossing the bonding layer to carry data between different processing circuits on different IC dies, at least two of the connections having a center-to-center pitch that is less than 5 microns.

2. The 3D processor circuit of claim 1, wherein the center-to-center pitch of the two connections is less 3 microns.

3. The 3D processor circuit of claim 1, wherein the center-to-center pitch of the two connections is less 0.5 microns.

4. The 3D processor circuit of claim 1, wherein
 the 3D processor is a multi-core processor,
 the first set of processor circuits of the first die comprises a first processor core,
 the second set of processor circuits of the second die comprises a first cache that at least partially overlaps the first processor core,
 the plurality of connections comprises a first set of connections to carry signals between the first processor core and the first cache, wherein each of a plurality of connections in the first set of connections has a center-to-center pitch to a neighboring connection that is less than 5 microns.

5. The 3D processor circuit of claim 4, wherein
the second set of processor circuits of the second die comprises a second processor core,
the first set of processor circuits of the first die comprises a second cache that at least partially overlaps the second processor core,
the plurality of connections comprises a second set of connections to carry signals between the second processor core and the second cache, wherein each of a plurality of connections in the second set of connections has a center-to-center pitch to a neighboring connection that is less than 5 microns.

6. The 3D processor circuit of claim 5, wherein the first set of processor circuits of the first die comprises a third cache for the first processor core, and the second set of processor circuits of the second die comprises a fourth cache for the second processor core.

7. The 3D processor circuit of claim 4, wherein the first cache is an L1 cache.

8. The 3D processor circuit of claim 4, wherein the first set of processor circuits of the first die comprises a second cache for the first processor core.

9. The 3D processor circuit of claim 1, wherein
the first and second dies are face-to-face mounted through a direct bonding process, and
each of a subset of connections is shorter than 5 microns.

10. The 3D processor circuit of claim 9, wherein each of the subset of connections is shorter than 3 microns.

11. The 3D processor circuit of claim 1, wherein in at least first region of the first IC die that overlaps a second region of the second IC die, a density of the connections crossing the bonding layer is at least 1,000 connections/mm$^2$ to allow a large number of signals to traverse between first and second circuits in the first and second regions of the first and second IC dies.

12. The 3D processor circuit of claim 1, wherein in at least first region of the first IC die that overlaps a second region of the second IC die, a density of the connections crossing the bonding layer is at least 10,000 connections/mm$^2$ to allow a large number of signals to traverse between first and second circuits in the first and second regions of the first and second IC dies.

13. The 3D processor circuit of claim 1, wherein in at least first region of the first IC die that overlaps a second region of the second IC die, a density of the connections crossing the bonding layer is at least 100,000 connections/mm$^2$ to allow a large number of signals to traverse between first and second circuits in the first and second regions of the first and second IC dies.

14. The 3D processor circuit of claim 1, wherein in at least first region of the first IC die that overlaps a second region of the second IC die, a density of the connections crossing the bonding layer is at least 1,000,000 connections/mm$^2$ to allow a large number of signals to traverse between first and second circuits in the first and second regions of the first and second IC dies.

15. The 3D processor circuit of claim 1, wherein
the 3D processor is a multi-core processor,
the first set of processor circuits of the first die comprises a first processor core,
the second set of processor circuits of the second die comprises a second processor core that at least partially overlaps the first processor core,
the plurality of connections comprises a first set of connections to carry signals between the first processor core and the second processor core, wherein each of a plurality of connections in the first set of connections has a center-to-center pitch to a neighboring connection that is less than 5 microns.

16. The 3D processor circuit of claim 1 further comprising a third IC die that includes an input/output (I/O) interface circuit to receive data from outside of the 3D processor circuit for the first and second sets of processor circuits, wherein the first and second IC dies are face-to-face mounted through a direct bonding process, while the third IC die is face-to-back mounted to one of the first and second IC dies.

17. The 3D processor circuit of claim 16, wherein the third IC dies further includes an embedded memory to store data, the embedded memory having a storage capacity larger than one of 200 megabytes, 500 megabytes and 1 gigabytes.

18. The 3D processor circuit of claim 1, wherein the second IC die that includes an input/output (I/O) interface circuit to receive data from outside of the 3D processor circuit for the first and second sets of processor circuits.

19. The 3D processor circuit of claim 1, wherein the multi-core processor is a graphics processing unit.

20. The 3D processor circuit of claim 1, wherein the multi-core processor is a central processing unit.

* * * * *